United States Patent
Zhu

(10) Patent No.: US 12,501,665 B2
(45) Date of Patent: Dec. 16, 2025

(54) SEMICONDUCTOR DEVICE HAVING ZIGZAG STRUCTURE, METHOD OF MANUFACTURING SEMICONDUCTOR DEVICE, AND ELECTRONIC DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 490 days.

(21) Appl. No.: 17/998,456

(22) PCT Filed: Mar. 11, 2021

(86) PCT No.: PCT/CN2021/080201
§ 371 (c)(1),
(2) Date: Nov. 10, 2022

(87) PCT Pub. No.: WO2021/227633
PCT Pub. Date: Nov. 18, 2021

(65) Prior Publication Data
US 2023/0187560 A1    Jun. 15, 2023

(30) Foreign Application Priority Data

May 11, 2020  (CN) .......................... 202010394934.3

(51) Int. Cl.
*H10D 30/67*    (2025.01)
*H10D 30/01*    (2025.01)
(Continued)

(52) U.S. Cl.
CPC ....... *H10D 30/6757* (2025.01); *H10D 30/031* (2025.01); *H10D 30/6735* (2025.01);
(Continued)

(58) Field of Classification Search
CPC .... H10B 43/27; H10B 41/27; H01L 21/76837
See application file for complete search history.

(56) References Cited

U.S. PATENT DOCUMENTS

| | | | |
|---|---|---|---|
| 2010/0240204 A1* | 9/2010 | Yeh .................... | H10D 84/0177 438/700 |
| 2012/0049268 A1* | 3/2012 | Chang .................... | H10B 43/27 257/324 |

(Continued)

FOREIGN PATENT DOCUMENTS

| | | |
|---|---|---|
| CN | 107735864 A | 2/2018 |
| CN | 110265399 A | 9/2019 |

(Continued)

OTHER PUBLICATIONS

International Search Report issued in International Application No. PCT/CN2021/080201 dated Jun. 9, 2021 (2 pages).

(Continued)

*Primary Examiner* — Brian Turner
(74) *Attorney, Agent, or Firm* — Osha Bergman Watanabe & Burton LLP

(57) ABSTRACT

A semiconductor device having a zigzag structure, a method of manufacturing the semiconductor device, and an electronic including the semiconductor device. The semiconductor device may include a semiconductor layer (1031) extending in zigzag in a vertical direction with respect to a substrate (1001). The semiconductor layer (1031) includes one or more first portions disposed in sequence and spaced apart from each other in the vertical direction and second portions respectively disposed on and connected to opposite ends of each first portion. A second portion at one end of each first portion extends from the one end in a direction of leaving the substrate, and a second portion at the other end of the each first portion extends from the other end in a (Continued)

direction of approaching the substrate. First portions adjacent in the vertical direction are connected to each other by the same second portion.

28 Claims, 27 Drawing Sheets

(51) Int. Cl.
  *H10D 62/17* (2025.01)
  *H10D 64/01* (2025.01)
  *H10D 84/01* (2025.01)
  *H10D 84/03* (2025.01)
  *H10D 84/85* (2025.01)

(52) U.S. Cl.
  CPC ......... *H10D 62/371* (2025.01); *H10D 64/017* (2025.01); *H10D 84/0167* (2025.01); *H10D 84/0188* (2025.01); *H10D 84/0191* (2025.01); *H10D 84/038* (2025.01); *H10D 84/859* (2025.01)

(56) References Cited

U.S. PATENT DOCUMENTS

| | | | |
|---|---|---|---|
| 2012/0217583 A1* | 8/2012 | Zhu | H10D 62/822 |
| | | | 257/E21.409 |
| 2017/0213888 A1 | 7/2017 | Chang et al. | |
| 2019/0280005 A1 | 9/2019 | Bin et al. | |
| 2020/0168636 A1* | 5/2020 | Majhi | H10D 86/215 |
| 2022/0328628 A1 | 10/2022 | Zhu | |

FOREIGN PATENT DOCUMENTS

| | | |
|---|---|---|
| CN | 111048588 A | 4/2020 |
| CN | 111106111 A | 5/2020 |
| CN | 111106176 A | 5/2020 |
| CN | 111554747 A | 8/2020 |

OTHER PUBLICATIONS

Written Opinion issued in International Application No. PCT/CN2021/080201 dated Jun. 9, 2021 (4 pages).

Office Action issued in Chinese Application No. 202010394934.3, mailed on Mar. 25, 2023 (103 pages).

* cited by examiner

SEMICONDUCTOR DEVICE HAVING ZIGZAG STRUCTURE, METHOD OF MANUFACTURING SEMICONDUCTOR DEVICE, AND ELECTRONIC DEVICE

CROSS REFERENCE TO RELATED APPLICATION(S)

This application claims priority to Chinese Patent Application No. 202010394934.3, filed on May 11, 2020 and entitled "Semiconductor device having zigzag structure, method of manufacturing semiconductor device, and electronic device", the content of which is incorporated herein in its entirety by reference.

TECHNICAL FIELD

The present disclosure relates to the field of semiconductors, and more particularly, to a semiconductor device having a zigzag structure, a method of manufacturing the semiconductor device, and an electronic device including the semiconductor device.

BACKGROUND

Various different structures have been proposed to meet the challenge of further miniaturization of the semiconductor device, such as a fin field effect transistor (FinFET) and a multi-bridge channel field effect transistor (MBCFET). However, further reducing the size of the FinFET and the MBCFET is limited.

SUMMARY

In view of the above, the present disclosure aims to provide, among others, a semiconductor device having a zigzag structure, a method of manufacturing the semiconductor device, and an electronic device including the semiconductor device.

According to an aspect of the present disclosure, there is provided a semiconductor device, including one or more first portions disposed in sequence and spaced apart from each other in the vertical direction and second portions respectively disposed on and connected to opposite ends of each first portion. A second portion at one end of each first portion extends from the one end in a direction of leaving the substrate, and a second portion at the other end of the each first portion extends from the other end in a direction of approaching the substrate. First portions adjacent in the vertical direction are connected to each other by the same second portion.

According to another aspect of the present disclosure, there is provided a method of manufacturing a semiconductor device, including: sequentially forming, on a substrate, a stack of at least one first sacrificial layer alternated with at least one second sacrificial layer; forming, in the stack, a first trench extending in a first direction, wherein the first sacrificial layer is exposed at a sidewall of the first trench; forming, on the sidewall of the first trench, a third sacrificial layer connected to the first sacrificial layer; forming, in the stack, a second trench spaced apart from the first trench in a second direction and extending in the first direction, wherein the second direction intersects the first direction; removing the second sacrificial layer via the second trench; and forming, via the second trench, a semiconductor layer extending along a surface of the first sacrificial layer and a surface of the third sacrificial layer.

According to yet another aspect of the present disclosure, there is provided an electronic device including the semiconductor device described above.

According to embodiments of the present disclosure, the semiconductor device may include a semiconductor layer extending upwardly in zigzag from the substrate. Such semiconductor layer may be used as a channel portion, so the semiconductor device may be called as a Zig zAg Channel Field Effect Transistor (ZACFET). This may provide high performance and high integration.

BRIEF DESCRIPTION OF THE DRAWINGS

The above and other objects, features, and advantages of the present disclosure will become more apparent from following descriptions on embodiments thereof with reference to attached drawings, in which:

FIGS. 18(*a*), 19(*a*), 23(*a*) and 26(*a*) are top views, the top view of FIG. 18(*a*) shows positions of line AA', line BB' and line CC';

FIGS. 19(*b*), 20(*a*), 21(*a*), 22(*a*), 23(*b*) and 24(*b*) are cross-sectional views taken along line BB';

FIGS. 19(*c*), 20(*b*), 21(*b*), 22(*b*), 22(*c*), 23(*c*) and 24(*c*) are cross-sectional views taken along line CC'.

Throughout the drawings, the same or similar reference numbers denote the same or similar elements.

DETAILED DESCRIPTION OF EMBODIMENTS

Figure 1:
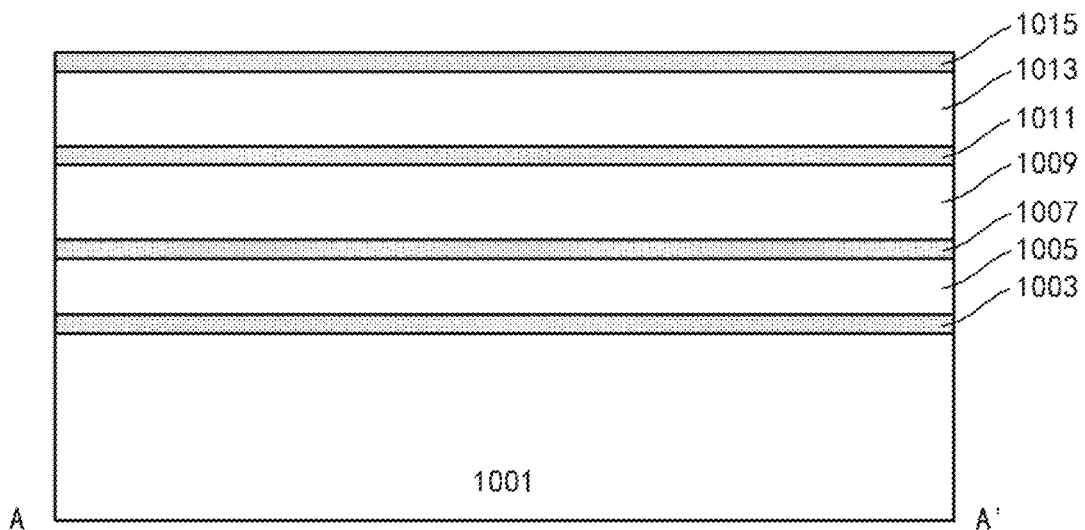
FIGS. 1 to 26(*b*) are schematic views showing some stages in a process of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art may also devise regions/layers of other different shapes, sizes, and relative positions as desired in practice.

In the context of the present disclosure, when a layer/element is recited as being "on" a further layer/element, the layer/element may be disposed directly on the further layer/element, or otherwise there may be an intervening layer/element interposed therebetween. Further, if a layer/element is "on" a further layer/element in an orientation, then the layer/element may be "under" the further layer/element when the orientation is turned.

According to an embodiment of the present disclosure, a semiconductor device is proposed. The semiconductor device may have a semiconductor layer that extends upwardly in zigzag from a substrate. The semiconductor layer may include one or more first portions (e.g. extending in a substantially lateral direction with respect to the substrate) that are sequentially disposed and spaced apart from each other in a vertical direction with respect to the substrate (e.g. a direction substantially perpendicular to a surface of the substrate) and second portions (e.g. extending in substantially the vertical direction with respect to the substrate) respectively disposed at and connected to opposite ends of each of the first portions. The second portions at opposite ends of the first portions respectively extend in opposite directions (e.g. in a direction of approaching the substrate and a direction of leaving the substrate, respectively). Adjacent first portions are connected to each other through a respective second portion. Accordingly, the semiconductor layer may have a zigzag shape.

The zigzag semiconductor layer may be used as a channel portion of the semiconductor device. Accordingly, a Zig zAg Channel Field Effect Transistor (ZACFET) may be formed. In this case, the semiconductor layer may be similar to a fin in a Fin Field Effect Transistor (FinFET). However, unlike the fin in a conventional FinFET, the semiconductor layer includes a laterally extending portion (e.g. the first portion) in addition to a vertically extending portion (e.g. the second portion). Accordingly, in the semiconductor device according to the embodiment of the present disclosure, a channel width may be adjusted by adjusting a width of the first portion of the semiconductor layer while keeping a height of the semiconductor layer in the vertical direction substantially unchanged.

The so-called "laterally extending" here does not necessarily mean extending completely parallel to the surface of the substrate, and a deviation by a certain angle is allowed. Likewise, the so-called "vertically extending" does not necessarily mean extending completely perpendicular to the surface of the substrate, and a deviation by a certain angle is allowed. Such deviations are due to, for example, manufacturing tolerances, process limitations, and the like.

As described below, such zigzag semiconductor layer may be fabricated by using a comb-shaped structure as a template. For example, the semiconductor layer may be epitaxially grown by using the comb-shaped structure as a seed layer. Accordingly, the semiconductor layer may be integral and may have a substantially uniform thickness. A semiconductor layer grown on a laterally extending surface of the comb-shaped structure may constitute the "first portion". A semiconductor layer grown on a vertically extending surface of the comb-shaped structure may constitute the "second portion".

As described below, the comb-shaped structure may be formed by epitaxial growth combined with etching. If the etching is performed along the vertical direction, each comb-shaped portion of the comb-shaped structure may be substantially aligned with each other in the vertical direction. In this case, first portions of the semiconductor layer grown along the comb-shaped structure may also be substantially aligned in the vertical direction and may have substantially the same width. In addition, second portions on the same side may also be aligned in the vertical direction. When each comb-shaped portion of the comb-shaped structure has a substantially uniform thickness, adjacent first portions may also spaced from each other by a substantially uniform interval.

In a case of ZACFET, the semiconductor device may further include source/drain portions on opposite sides of the semiconductor layer in a first direction. The semiconductor layer is connected between the source/drain portions on opposite sides of the semiconductor layer, wherein a conductive channel between the source/drain portions may be formed. The source/drain portions may include a material identical to a material of the channel portion, or may include a material different from the material of the channel portion, so as to for example, apply stress to the channel portion to enhance device performance. The semiconductor layer may include a single crystal semiconductor material to improve the device performance. Of course, the source/drain portions may also include the single crystal semiconductor material.

The semiconductor device may further include a gate stack intersecting the channel portion. The gate stack may extend in a second direction intersecting (e.g. perpendicular to) the first direction. Gate spacers may be formed on sidewalls on opposite sides of the gate stack in the first direction. The gate stack may be separated from the source/drain portions by the gate spacers. Outer sidewalls of the gate spacer facing each source/drain portion may be substantially coplanar in the vertical direction, and may be substantially coplanar with a sidewall of the semiconductor layer. Inner sidewalls of the gate spacer facing the gate stack may be substantially coplanar in the vertical direction, so that the gate stack may have a substantially uniform gate length. The gate spacer may have a substantially uniform thickness.

Such semiconductor device may be manufactured, for example, as follows.

A stack of at least one first sacrificial layer alternated with at least one second sacrificial layer may be sequentially formed on the substrate. Here, the first sacrificial layer may define the comb-shaped portion of the comb-shaped structure, while the second sacrificial layer may define an interval between the comb-shaped portions. In the stack, the bottom layer may be the first sacrificial layer, and the top layer may also be the first sacrificial layer. A first trench extending in the first direction may be formed in the stack. The first sacrificial layer (and the second sacrificial layer) is exposed at a sidewall of the first trench. A third sacrificial layer connected to the first sacrificial layer may be formed on the sidewall of the first trench. Accordingly, the comb-shaped structure is formed by the first sacrificial layer(s) extending laterally and the third sacrificial layer(s) extending vertically. Two comb-shaped structures being back-to-back may be formed on two sides of the first trench.

A second trench spaced apart from the first trench may be formed in the second direction intersecting (e.g. perpendicular to) the first direction. On the one hand, the second trench may expose the second sacrificial layer, so that the second sacrificial layer may be removed to release a zigzag surface of the comb-shaped structure (to be used as a seed for growing the semiconductor layer). On the other hand, the second trench may define a width of the first sacrificial layer and thus define a width of a laterally extending portion (i.e. the first portion described above) of the grown semiconductor layer. The second trench may also extend in the first direction, such that the first sacrificial layer has a substantially uniform width between the first trench and the second trench. The width of the first sacrificial layer may be different on two sides of the first trench to define different channel widths.

Surfaces of the first sacrificial layer and the third sacrificial layer are exposed via the second trench. The semiconductor layer may be grown on an exposed surface of the first sacrificial layer and an exposed surface of the third sacrificial layer. Since the first sacrificial layer and the third sacrificial layer are connected to each other to form the comb-shaped structure, the exposed surface of the first sacrificial layer and the exposed surface of the third sacrificial layer may be zigzag surfaces, and thus the grown semiconductor layer may have the zigzag shape.

The second trench may extend into the substrate, so that the formed semiconductor layer may be connected to the substrate, which is similar to the fin connected to the substrate in the FinFET.

An isolation layer may be formed on the substrate in consideration of an electrical isolation between the subsequently formed gate stack and the substrate. For example, a first isolation layer may be formed via the second trench. A second isolation layer may be formed via the first trench. That is, the isolation layers are respectively formed on two sides of the semiconductor layer. The two isolation layers may have substantially coplanar top surfaces.

A sacrificial gate may be formed on the isolation layer and patterned into a shape of a stripe extending in the second direction so as to intersect the semiconductor layer. A plurality of strip-shaped sacrificial gates spaced in the first direction may be formed. Each strip-shaped sacrificial gate and the underlying semiconductor layer may respectively form different semiconductor devices. The semiconductor layer may be patterned by using the sacrificial gate as a mask, so that the semiconductor layer is left below the sacrificial gate to serve as the channel portion. On opposite sides of the semiconductor layer in the first direction on the substrate, the source/drain portions in contact with the semiconductor layer may be formed by, for example, epitaxial growth. The sacrificial gate may be replaced by a real gate stack through a gate replacement process.

The present disclosure may be presented in various forms, and some examples of which will be described below. In the following description, the selection of various materials is involved. For the selection of materials, etching selectivity is also considered in addition to considering their functions (for example, semiconductor materials are configured to form active areas and dielectric materials are configured to form the electrical isolation). In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity with respect to other layers exposed to the same etching recipe.

FIGS. 1 to 26(b) are schematic views showing some stages in a process of manufacturing a semiconductor device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for the convenience of description.

On the substrate 1001, an etching stop layer 1003 and an isolation defining layer 1005 may be formed by, for example, epitaxial growth. The isolation defining layer 1005 may define a space for forming an isolation layer later, and have a thickness of, for example, about 20 nm to 150 nm. The etching stop layer 1003 may define an etching stop position for the isolation defining layer during the process of removing the isolation defining layer 1005 (in order to form the isolation layer), and have a thickness of, for example, about 5 nm to 20 nm.

Adjacent layers among the substrate 1001, the etching stop layer 1003, and the isolation defining layer 1005 may have etching selectivity with respect to each other. For example, the substrate 1001 may be a silicon wafer, the etching stop layer 1003 may include SiGe (e.g. an atomic percentage of Ge is about 20% to 50%), and the isolation defining layer 1005 may include Si. In this example, both the substrate 1001 and the isolation defining layer 1005 include Si, so that the etching stop layer 1003 may define the etching stop position when the isolation defining layer 1005 is selectively etched later. However, the present disclosure is not limited thereto. For example, the etching stop layer 1003 may also be omitted when the substrate 1001 and the isolation defining layer 1005 include materials that are etching selective with respect to each other.

A stack of first sacrificial layers 1007, 1011 and 1015 alternated with second sacrificial layers 1009 and 1013 may be formed on the isolation defining layer 1005 by, e.g. epitaxial growth. The first sacrificial layers 1007, 1011 and 1015 may then define a seed layer for growing the semiconductor layer, and have a thickness of, e.g. about 5 nm to 15 nm. Each of the first sacrificial layers 1007, 1011 and 1015 may have a substantially uniform thickness, and their thicknesses may be the same as each other. The second sacrificial layers 1009 and 1013 may define an interval between adjacent lateral portions in the grown semiconductor layer, and have a thickness of, e.g. about 9 nm to 30 nm. Each of the second sacrificial layers 1009 and 1013 may have a substantially uniform thickness, and their thicknesses may be the same as each other. The number of the first sacrificial layers and the second sacrificial layers in the alternating stack may vary depending on the device design, e.g. may be more or less.

The isolation defining layer 1005 and adjacent layers among the above-mentioned layers formed on the isolation defining layer 1005 may have etching selectivity with respect to each other. In addition, considering the convenience of subsequent processes, the first sacrificial layers 1007, 1011 and 1015 may include similar or the same material as the etching stop layer 1003, so as to have similar or the same etching selectivity for the same etching recipe subsequently. For example, the first sacrificial layers 1007, 1011 and 1015 may include SiGe, wherein the atomic percentage of Ge is substantially the same or close to that in the etching stop layer 1003, about 20% to 50%. The second sacrificial layers 1009 and 1013 may include Si.

In order to form a semiconductor layer extending in zigzag, a comb-shaped seed layer may be provided.

Figure 2:
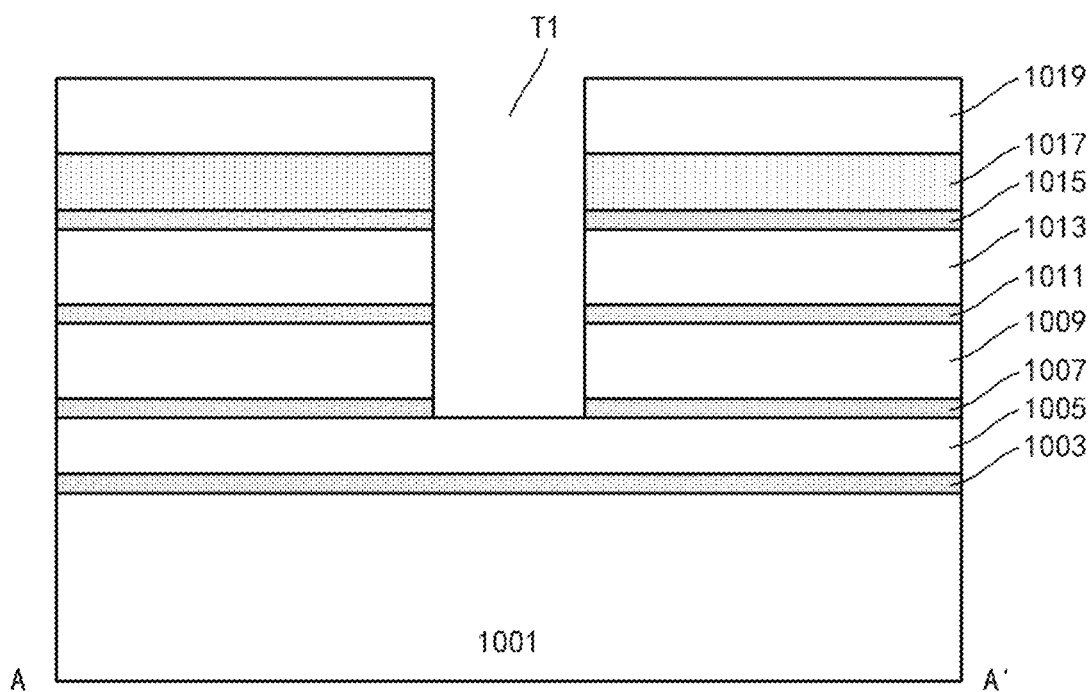

To this end, as shown in FIG. 2, a trench T1 may be formed in the stack. To form the trench T1, a hard mask layer 1017 (e.g. oxide such as silicon oxide) may be formed on the substrate 1001. An opening may be defined in the hard mask layer 1017 by using a photoresist 1019. Selective etching, such as reactive ion etching (RIE), may be sequentially performed on each layer in the stack by using the opening in the hard mask layer 1017. RIE may be performed in the vertical direction (e.g. a direction substantially perpendicular to the surface of the substrate), such that the trench T1 may have vertical sidewalls. Each of the first sacrificial layers 1007, 1011 and 1015 may be exposed at the sidewalls of the trench T1. The trench T1 may extend in the first direction (e.g. a direction perpendicular to the paper in the figure). Additionally, RIE may stop at the isolation defining layer 1005. Afterwards, the photoresist 1019 may be removed.

Figure 3:
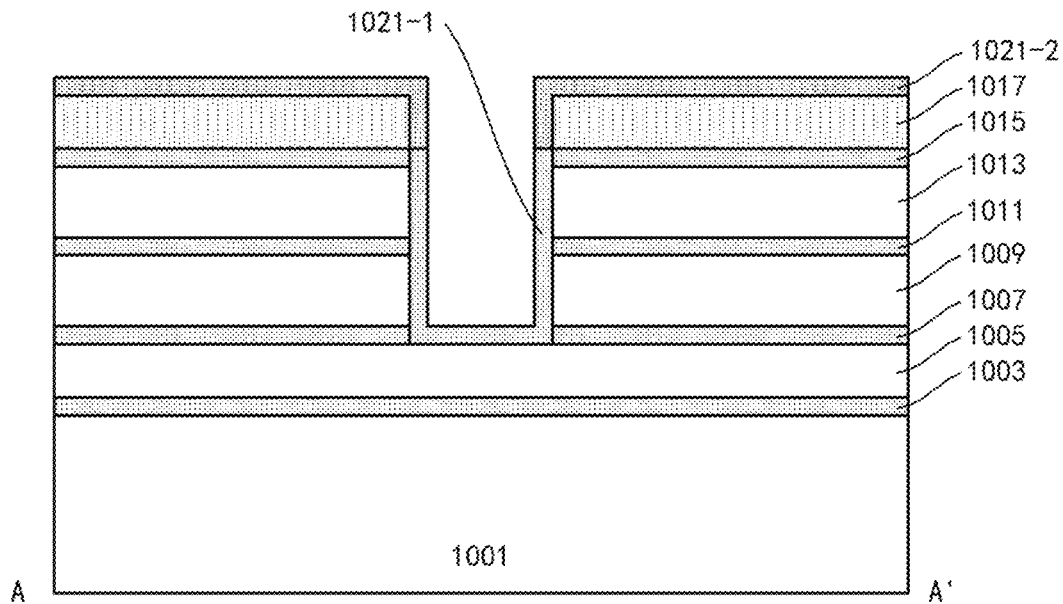

As shown in FIG. 3, a third sacrificial layer 1021-1 may be formed on the sidewalls (and the bottom surface) of the trench T1 by, for example, epitaxial growth. The third sacrificial layer 1021-1 connects the respective first sacrificial layers 1007, 1011 and 1015 to each other. Additionally, the growth may also occur on a surface of the hard mask layer 1017, thereby forming a material layer 1021-2. The third sacrificial layer 1021-1 and the material layer 1021-2 may be grown by the same reactive gas, and thus may include the same or similar components. However, the third sacrificial layer 1021-1 and the material layer 1021-2 may exhibit different states such as different crystal phases due to different growth surfaces. For example, the third sacrificial layer 1021-1 may be in a single crystal phase due to growth on a surface of a semiconductor material, while the material layer 1021-2 may be in a polycrystalline phase due to growth on a surface of a dielectric material. Here, the third sacrificial layer 1021-1 and the first sacrificial layers 1007, 1011 and 1015 define the seed layer for subsequent growth of the semiconductor layer. Thus, the third sacrificial layer 1021-1 may have similar or the same material as the first sacrificial layers 1007, 1011 and 1015, so as to have similar or the same etching selectivity for the same etching recipe subsequently. For example, the third sacrificial layer 1021-1 may include (single crystal) SiGe, wherein the atomic percentage of Ge is substantially the same or close to that in the first sacrificial layers 1007, 1011 and 1015, about 20% to 50%. The material layer 1021-2 may include (polycrystalline) SiGe.

Figure 4:
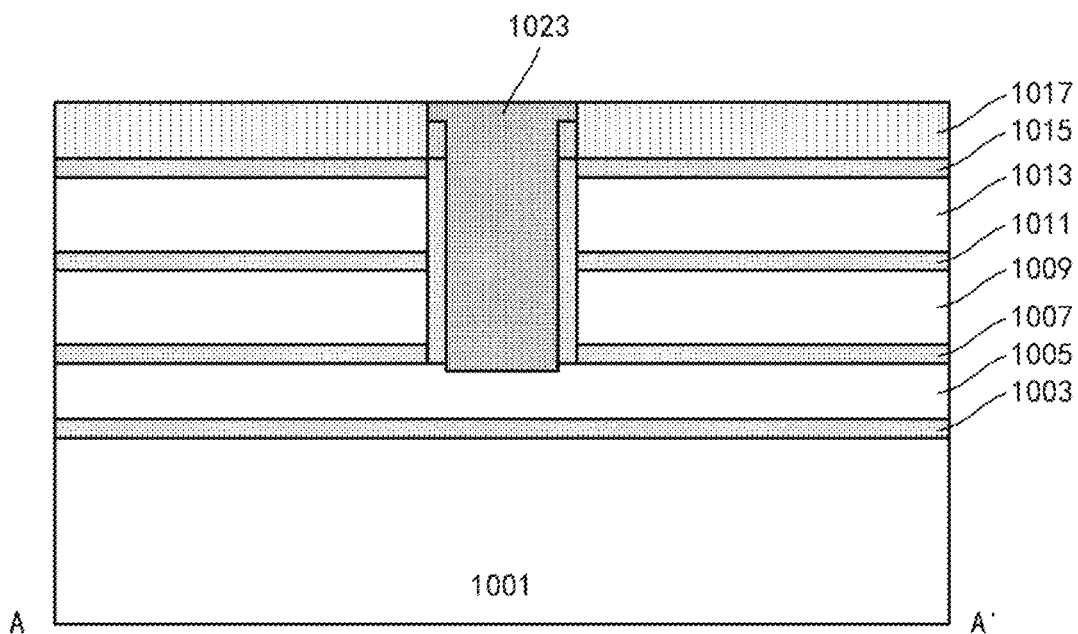

As shown in FIG. 4, the third sacrificial layer 1021-1 (and the material layer 1021-2) may be anisotropic selectively etched such as RIE in the vertical direction to remove a lateral portion of the third sacrificial layer 1021-1, such that the third sacrificial layer 1021-1 is in the form of a spacer, and forms the comb-shaped structure with the first sacrificial layers 1007, 1011 and 1015. Similarly, the material layer 1021-2 may also be in the form of the spacer, and is located on the third sacrificial layer 1021-1 to cover the top of the third sacrificial layer 1021-1. This may protect the top of the third sacrificial layer 1021-1, and thus protect the subsequently grown semiconductor layer. Hereinafter, the material layer 1021-2 is referred to as a protective layer. In addition, during the RIE process of forming the spacer, the trench T1 may be deepened to extend into the isolation defining layer 1005. A support portion 1023 may be formed in the trench T1 to support the comb-shaped structure in a subsequent process. In addition, in this embodiment, the isolation defining layer 1005 and the second sacrificial layers 1009 and 1013 both include Si. The support portion 1023 may also prevent the isolation defining layer 1005 from being removed during subsequent removal of the second sacrificial layers 1009 and 1013. The support portion 1023 may include a dielectric material with etching selectivity with respect to the hard mask layer 1017, such as nitride (e.g. silicon nitride). The formation of the support portion 1023 may include depositing the material and then etching back to expose the hard mask layer or performing a planarization such as chemical mechanical polishing (CMP) to expose the hard mask layer 1017.

The widths of the first sacrificial layers 1007, 1011 and 1015 (widths in the horizontal direction in the figure) may be adjusted according to the performance requirements of the device to be formed. Accordingly, the width of the laterally extending portion of the subsequently grown semiconductor layer may be adjusted.

Figure 5:
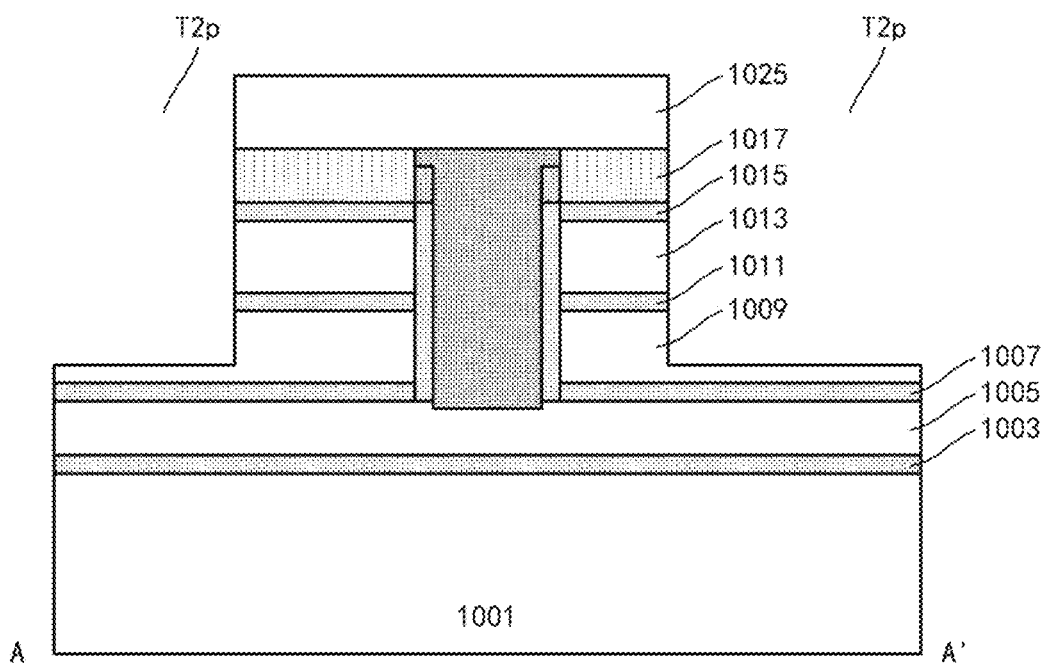

For example, as shown in FIG. 5, a photoresist 1025 may be formed on the hard mask layer 1017. The photoresist 1025 may be patterned by photolithography to shield the first sacrificial layers 1007, 1011 and 1015 by a certain width. In this example, an example is described in which two devices are respectively formed on opposite sides (left and right sides in the figure) of the support portion 1023. The two devices may have different performance requirements such as different current driving capabilities, and thus the two devices may have different sizes. Accordingly, the photoresist 1025 covers different widths of the first sacrificial layers 1007, 1011 and 1015 on opposite sides of the support portion 1023. However, the present disclosure is not limited thereto.

By using the photoresist 1025 as the mask, selective etching, such as RIE may be performed on the hard mask layer 1017 and the layers in the stack, to adjust the first sacrificial layers 1007, 1011 and 1015 to a desired width. In addition, the second sacrificial layers 1009 and 1013 may be removed, thereby exposing the surface of the comb-shaped structure to grow the semiconductor layer. In this example, both the isolation defining layer 1005 and the second sacrificial layers 1009 and 1013 include Si. In order to avoid the adverse affection to the isolation defining layer 1005 by the removal of the second sacrificial layers 1009 and 1013, the etching with the photoresist 1025 as the mask may be carried out to the bottom second sacrificial layer 1009, but not to the bottom first sacrificial layer 1007 (which may protect the isolation defining layer 1005 in the process of removing the second sacrificial layers 1009 and 1013), thereby forming a preparatory trench T2$p$. RIE may be performed in the vertical direction so that the preparatory trench T2$p$ may have vertical sidewalls. The second sacrificial layers 1009 and 1013 are exposed at the sidewalls of the preparatory trench T2$p$ and thus may be removed. The preparatory trench T2$p$ is spaced apart from the trench T1 (currently filled with the support portion 1023) in the second direction (e.g. the horizontal direction within the drawing) intersecting (e.g. perpendicular to) the first direction, thereby defining a certain width of the first sacrificial layers 1011 and 1015 between the preparatory trench T2$p$ and the trench T1. The width of the bottom first sacrificial layer 1007 is kept as original. Afterwards, the photoresist 1025 may be removed.

Figure 6:
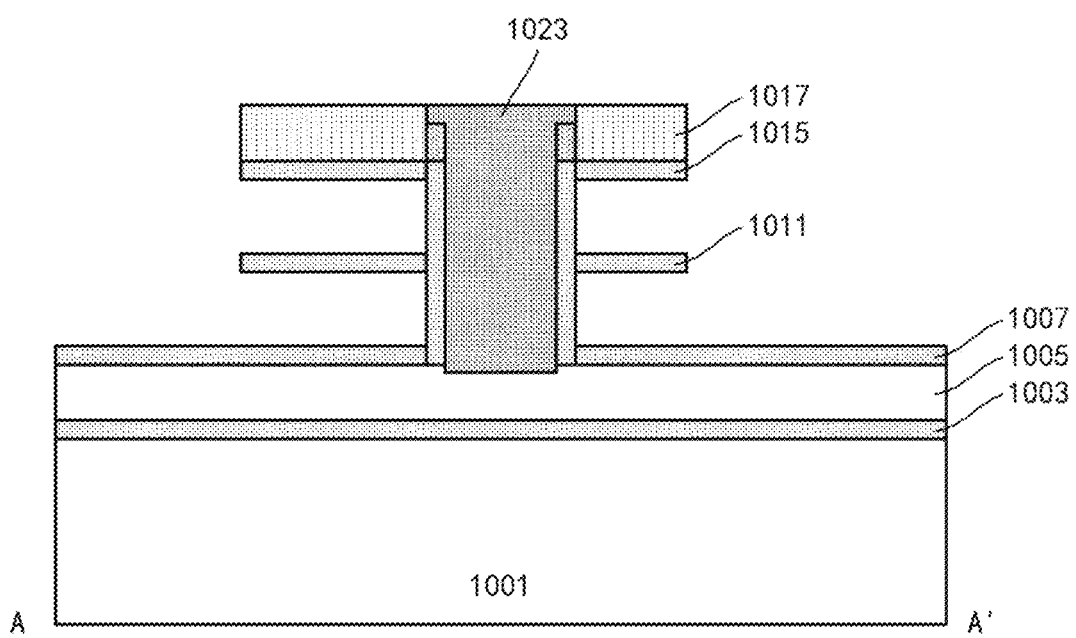
Figure 7A:
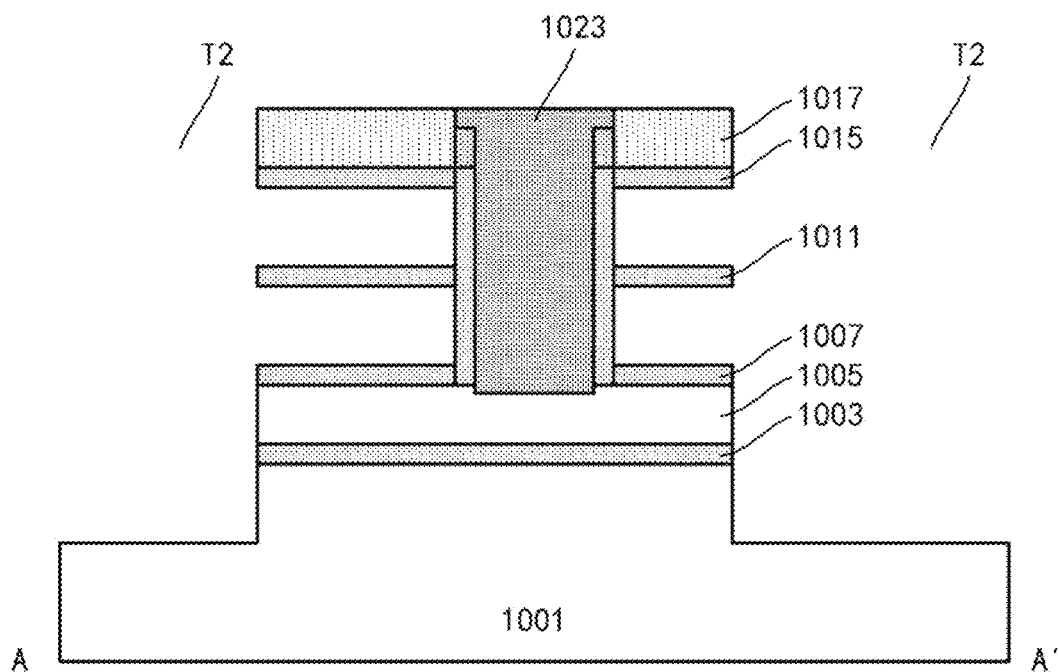
Figure 7B:
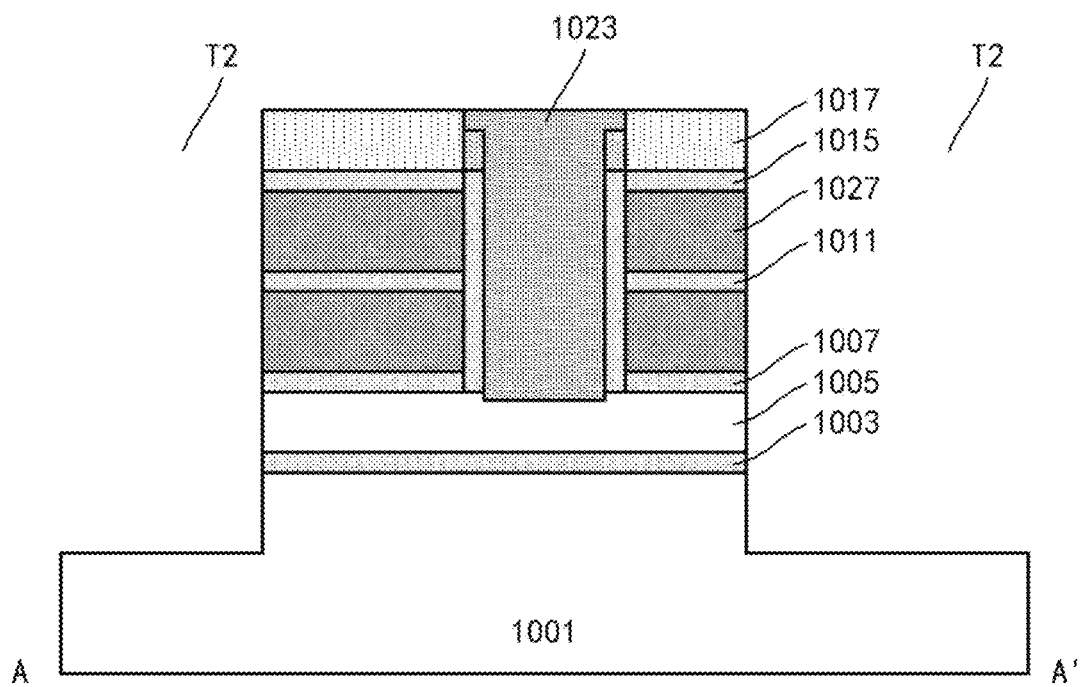

As shown in FIG. 6, the second sacrificial layers 1009 and 1013 may be removed by selective etching, e.g. wet etching using a TMAH solution, via the preparatory trench T2$p$. Due to the coverage of the first sacrificial layer 1007, the isolation defining layer 1005, which is also formed of Si in this example, may not be affected.

Next, the width adjustment of the first sacrificial layer 1007 may be continued. For example, as shown in FIG. 7($a$), selective etching, such as RIE, may be performed on the first sacrificial layer 1007 by using the hard mask layer 1017 as an etching mask. RIE may be performed in the vertical direction. Accordingly, the width of the first sacrificial layer 1007 may be changed to be substantially the same as the other first sacrificial layers 1011 and 1015. According to an embodiment of the present disclosure, in order to improve device performance, such as device heat dissipation performance, the semiconductor layer grown later may be in contact with the substrate. To this end, RIE may continue and proceed into the substrate 1001. Then, the preparatory trench T2$p$ is deepened and enters the substrate 1001 to form a trench T2. A part of the surface of the substrate 1001 is exposed in the trench T2. Therefore, the comb-shaped structure formed by the first sacrificial layers 1007, 1011 and 1015 and the third sacrificial layer 1021-1 is exposed through the trench T2.

According to other embodiments of the present disclosure, in order to protect the comb-shaped structure, a protective layer 1027 may be formed, before deepening the preparatory trench T2$p$ (see the structure shown in FIG. 6), on the substrate to fill gaps between the first sacrificial layers

1007, 1011 and 1015. Then the hard mask layer 1017 is used as the etching mask to deepen the preparatory trench T2p to obtain the structure shown in FIG. 7(b). The protective layer 1027 may include a material having etching selectivity with respect to the remaining layers, such as SiC. After that, the protective layer 1027 may be removed by selective etching. The structure shown in FIG. 7(a) may be obtained.

Figure 8:
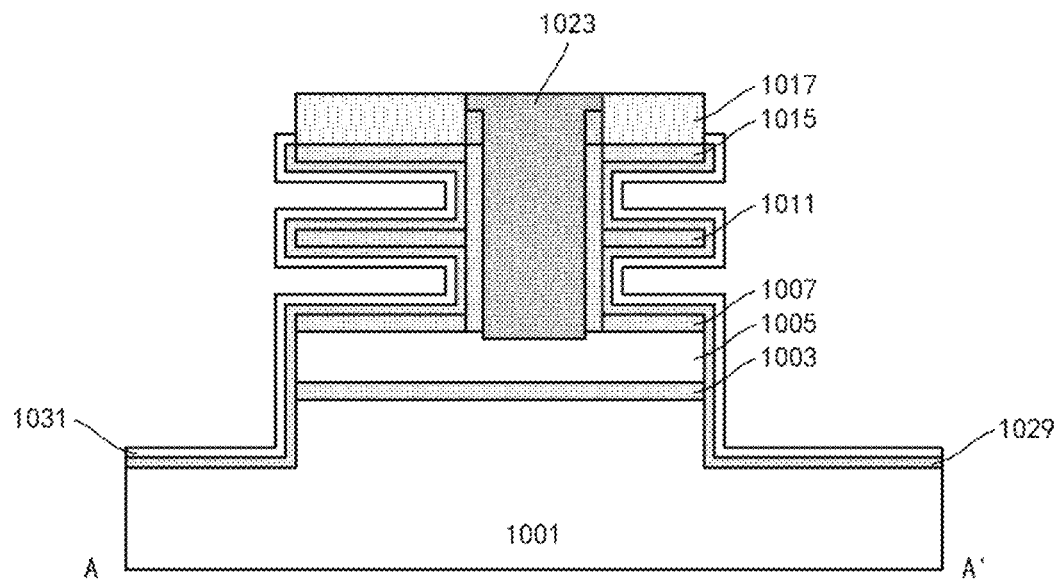

The semiconductor layer may be grown on the surface of the comb-shaped structure exposed through the trench T2. In this example, the Si process is described as an example, that is, a Si semiconductor layer will be grown subsequently. In this case, in order to avoid affecting the grown semiconductor layer during the subsequent removal of the isolation defining layer 1005 (also Si in this example) to form the isolation layer, as shown in FIG. 8, an etching stop layer 1029 may be formed by selective epitaxial growth to cover the exposed surface of the isolation defining layer 1005. Of course, the selective epitaxial growth may also occur on surfaces of other semiconductor layers, so that the etching stop layer 1029 may also be formed on these surfaces. The etching stop layer 1029 may be formed in a substantially conformal manner to maintain the profile of the comb-shaped structure. Accordingly, the etching stop layer 1029 and the previously formed comb-shaped structure constitute a seed layer that is still comb-shaped. Such seed layer may then be removed and thus may have similar or the same etching selectivity for the same etching recipe. For example, the etching stop layer 1029 may include SiGe, wherein the atomic percentage of Ge is substantially the same or close to that in the seed layer, about 20% to 50%. The etching stop layer 1029 may be formed thinner, for example, about 1 nm to 3 nm. After that, a semiconductor layer 1031 may be formed on a surface of the comb-shaped seed layer (more specifically, the etching stop layer 1029), for example, by selective epitaxial growth. The semiconductor layer 1031 may be formed in a substantially conformal manner so as to extend along the surface of the comb-shaped seed layer, and thus the semiconductor layer 1031 have a shape that extends upwardly in zigzag. The thickness of the semiconductor layer 1031 is, for example, about 5 nm to 10 nm.

As described above, in this example, the semiconductor layer 1031 may include Si. However, the present disclosure is not limited thereto. For example, the semiconductor layer 1031 may include a semiconductor material different from a material of the substrate 1001, e.g. include a material with high carrier mobility, to improve device performance. In a case where the semiconductor layer 1031 has an etching selectivity with respect to the isolation defining layer 1005, the etching stop layer 1029 may be omitted.

In a case where the semiconductor layer 1031 is used as the channel portion of the semiconductor device, a punch-through stopping portion (PTS) (see 1041n and 1041p shown in FIG. 13) may be formed in a lower portion of the semiconductor layer 1031 (i.e. a portion below the portion of the semiconductor layer 1031 that serves as the channel) in order to suppress a leakage current.

PTS may be achieved by doping the lower portion of the semiconductor layer 1031 with a conductivity type opposite to that of the device. Such doping may be achieved, for example, by solid-phase doping.

Figure 9:
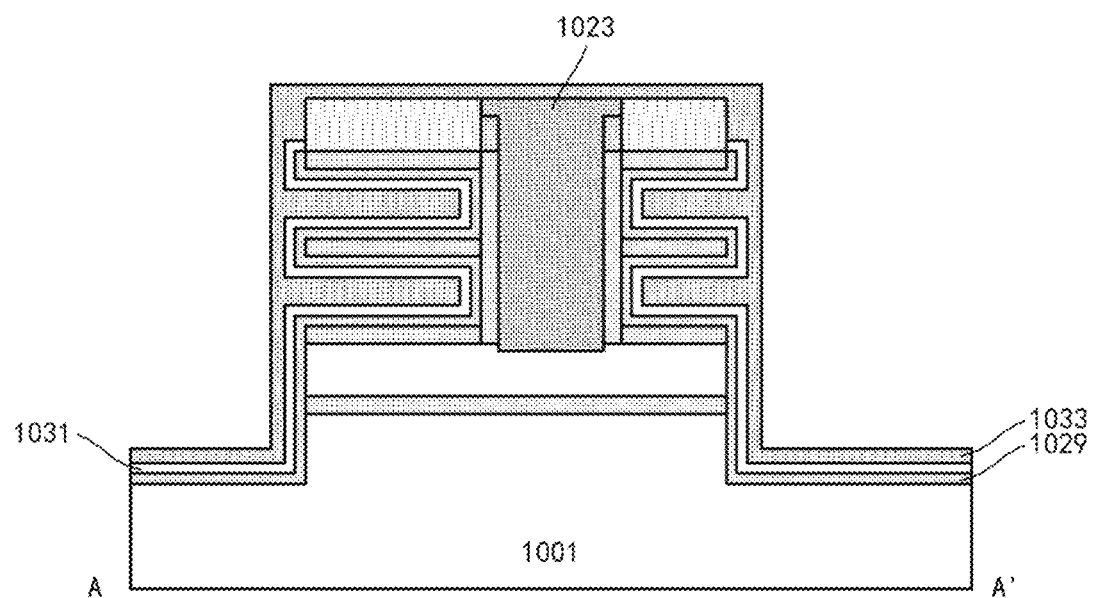
Figure 10:
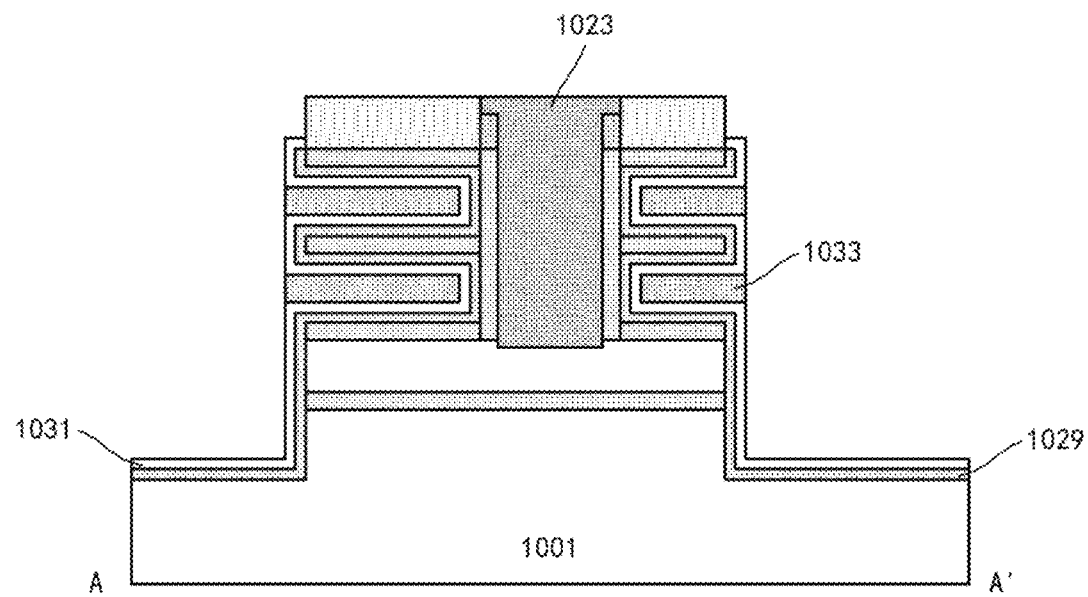

To avoid affecting the upper portion of the semiconductor layer 1031 (which is then used as the channel portion), a protective layer may be filled in the gaps of the comb-shaped structure. For example, as shown in FIG. 9, a protective layer 1033 may be formed by, for example, deposition. The thickness of the formed protective layer 1033 (e.g. about 3 nm to 7 nm) is sufficient to fill the gaps in the comb-shaped structure, particularly the gaps between the first sacrificial layers 1007, 1011, and 1015. Such protective layer 1033 and the seed layer currently surround the semiconductor layer 1031. Thus, the protective layer 1033 may be used as (a part of) the sacrificial gate and may be removed along with the seed layer in the subsequent gate replacement process, so that the protective layer 1033 and the seed layer may have similar or the same etching selectivity. For example, the protective layer 1033 may include (polycrystalline) SiGe, wherein the atomic percentage of Ge is substantially the same as or close to that in the seed layer, about 20% to 50%. As shown in FIG. 10, the protective layer 1033 may be etched back so that it remains in the gaps of the comb-shaped structure. To better control the amount of etch back, atomic layer etching (ALE) may be used. Accordingly, some surfaces of the semiconductor layer 1031, particularly the lower surface, are exposed.

Figure 11:
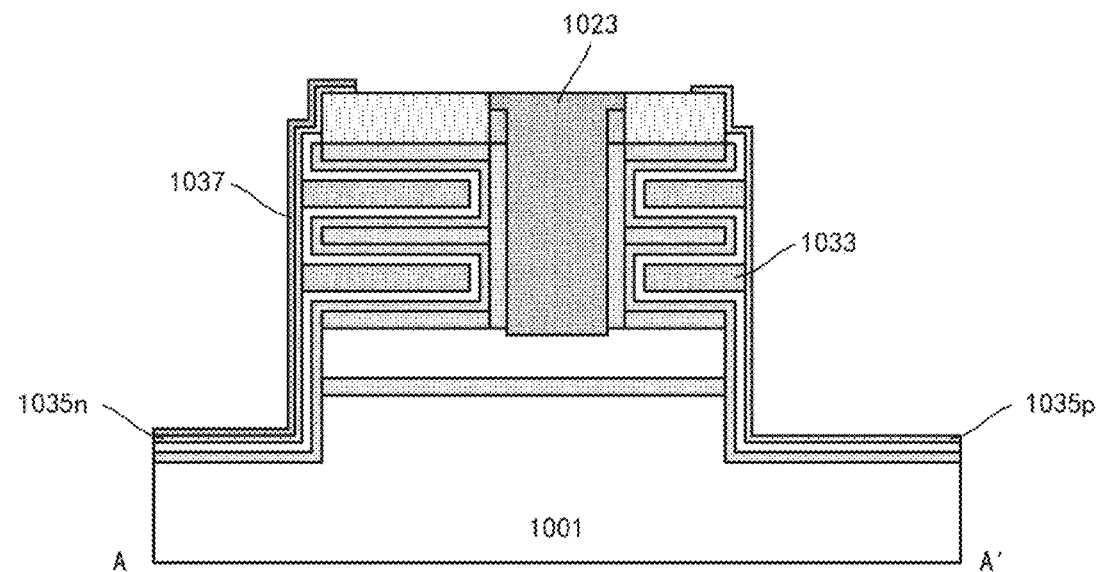

As shown in FIG. 11, a first dopant source layer 1035n may be formed by, for example, deposition. For example, the first dopant source layer 1035n may be an oxide layer containing an n-type dopant such as As or P, in which a concentration of the n-type dopant is about 0.1% to 5% and a thickness of the oxide layer is about 1 nm to 3 nm. To avoid cross contamination, a barrier layer 1037 may be formed on the first dopant source layer 1035n by, e.g. deposition. For example, the barrier layer 1037 may be formed of nitride or oxynitride and has a thickness of about 1 nm to 3 nm. The first dopant source layer 1035n and the barrier layer 1037 above the first dopant source layer 1035n may be patterned e.g. by photolithography, so as to be left on a p-type device region (e.g. a left region in the figure). Similarly, a second dopant source layer 1035p may be formed. For example, the second dopant source layer 1035p may be an oxide layer containing a p-type dopant such as B, in which a concentration of the p-type dopant is about 0.1% to 5% and a thickness of the oxide layer is about 1 nm to 3 nm. The second dopant source layer 1035p may be patterned, so as to be left on an n-type device region (e.g. the right region in the figure).

Here, the description is made by taking an example in which both a p-type device and an n-type device are formed (and thus a CMOS configuration may be formed). However, the present disclosure is not limited thereto. When forming a device of a single conductivity type, it is not necessary to respectively form dopant source layers having dopants of different conductivity types.

Currently, the first dopant source layer 1035n and the second dopant source layer 1035p further cover a part of the surface of the upper portion of the semiconductor layer 1031. However, only the lower portion of the semiconductor layer 1031 needs to be doped to form the PTS. The first dopant source layer 1035n and the second dopant source layer 1035p on the upper surface of the semiconductor layer 1031 may be removed. This may be combined with the formation of the isolation layer, since the upper and lower portions of the semiconductor layer 1031 are defined based on the top surface of the isolation layer.

Figure 12:
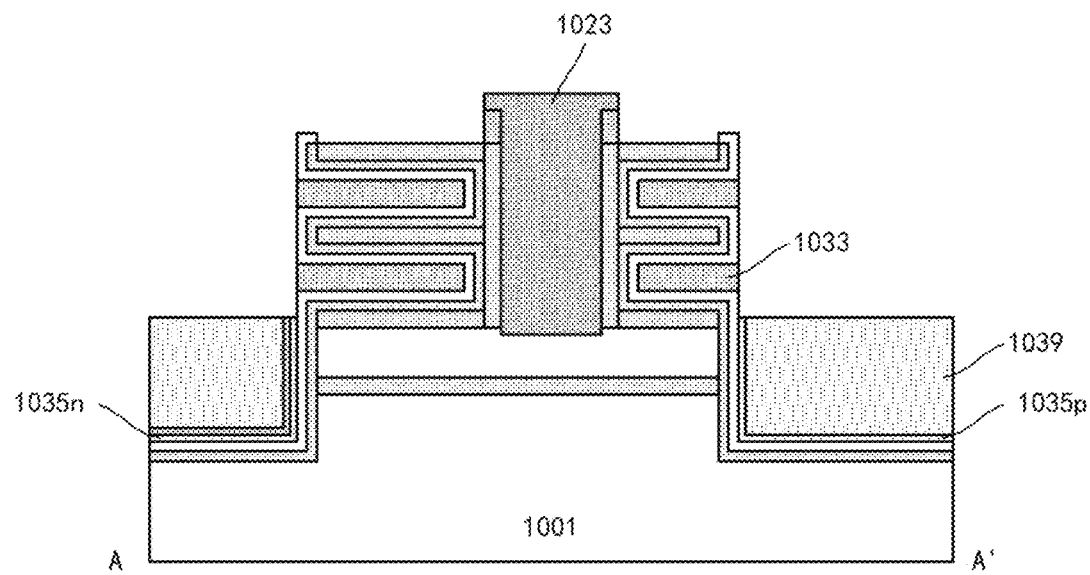

As shown in FIG. 12, an isolation layer 1039 may be formed at the bottom of the trench T2. The formation of the isolation layer 1039 may include depositing a dielectric material (e.g. oxide), planarizing the deposited dielectric material such as CMP, and etching back the dielectric material. A top surface of the isolation layer 1039 may be located approximately at a height where the bottom first sacrificial layer 1007 is located (or a height where a bottom surface of the subsequently formed gate stack is located). During etching back of the dielectric material such as oxide, the hard mask layer 1017, which is also formed of oxide in this example, may be removed. In a case that the isolation layer 1039 exists, selective etching, such as RIE, may be performed on (the barrier layer 1037 and) the first dopant source layer 1035*n* and the second dopant source layer 1035*p*, so that a part of them covered by the isolation layer 1039 may be reserved while the rest may be removed. Accordingly, the first dopant source layer 1035*n* and the second dopant source layer 1035*p* are left on the surface of the lower portion of the semiconductor layer 1031. Dopants in the dopant source layers 1035*n* and 1035*p* may be driven into the semiconductor layer 1031 and PTSs 1041*n* and 1041*p* are formed in the semiconductor layer 1031 by, for example, an annealing process (see FIG. 13). Due to the above process, top surfaces of the dopant source layers 1035*n* and 1035*p* are substantially flush with the top surface of the isolation layer 1039, so that top surfaces of the formed PTSs 1041*n* and 1041*p* may be near the top surface of the isolation layer 1039, or slightly beyond the top surface of the isolation layer 1039 due to, e.g. upward diffusion. The top surfaces of the PTSs 1041*n* and 1041*p* may be at substantially the same height with respect to the substrate in a case that they have substantially the same diffusion. The portion of the semiconductor layer 1031 located above the top surface of the isolation layer 1039, particularly above the top surfaces of the PTSs 1041*n* and 1041*p*, may be used as the fin.

Figure 13:
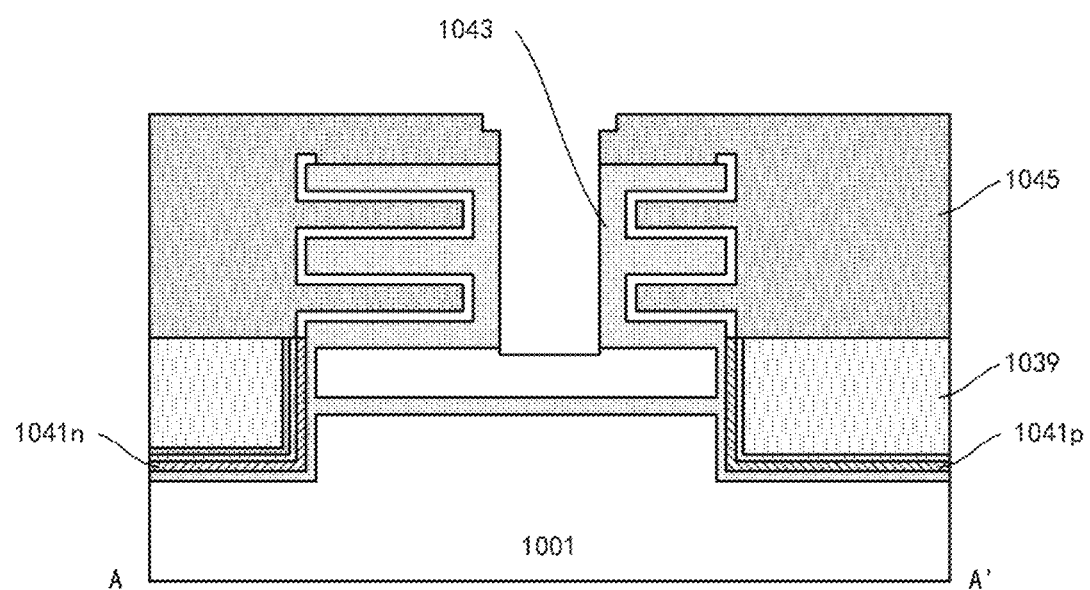

The isolation layer 1039 is formed on one side of the semiconductor layer 1031 (specifically, in the trench T2). Similarly, another isolation layer may be formed on another side of the semiconductor layer 1031. As mentioned above, the position of the isolation layer is defined by the isolation defining layer 1005. In order to protect the semiconductor layer 1031 and better support the semiconductor layer 1031 when removing the isolation defining layer 1005, a certain material layer may be formed in the trench T2. This material layer may then be used as (a part of) the sacrificial gate in consideration of the gate replacement process. For example, as shown in FIG. 13, the trench T2 may be filled with the material layer, e.g. by deposition. Such filling may be accomplished by deposition followed by planarization such as CMP (which may stop at the support portion 1023). Considering the convenience of the gate replacement process, the filled material layer and the previous protective layer 1033 may have similar or the same etching selectivity for the same etching recipe, for example, may include (polycrystalline) SiGe, wherein the atomic percentage of Ge is substantially the same as or close to that in the seed layer, e.g. being about 20% to 50%. Here, the material layer, the protective layer 1033 and the protective layer 1021-2, which are also (polycrystalline) SiGe in this example, are shown as integral in the subsequent figures and designated as 1045. Similarly, the seed layer and the etching stop layer, both of which are formed of (single crystal) SiGe in this example, are shown as integral in the subsequent figures and are designated as 1043. These material layers 1043 and 1045 define (a part of) the sacrificial gate, which may be referred to as the sacrificial gate hereinafter. Afterwards, the support portion 1023 may be removed by selective etching such as RIE, so that the trench T1 is emptied, and thus the underlying isolation defining layer 1005 is exposed.

Figure 14:
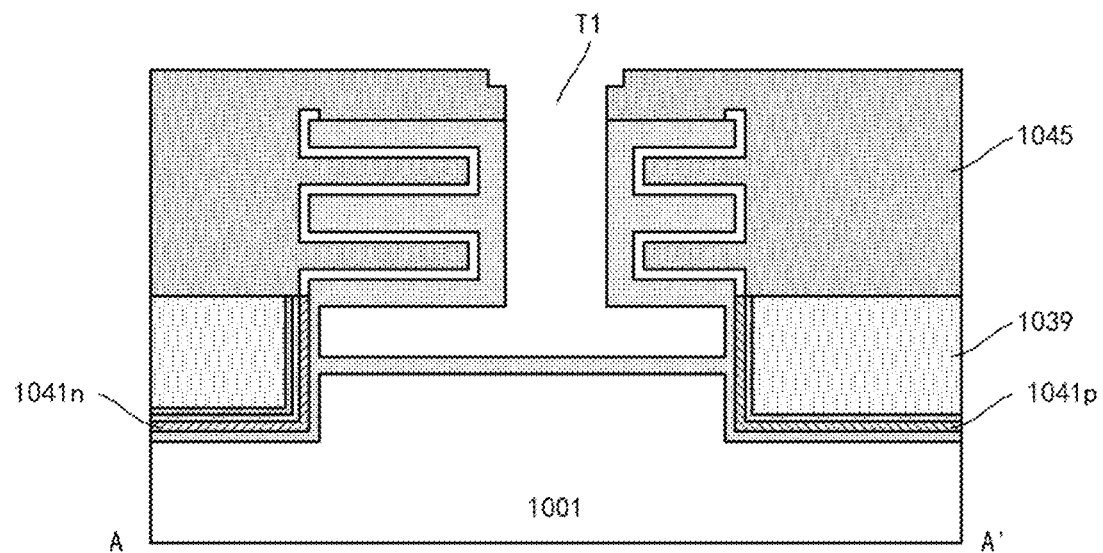

As shown in FIG. 14, the isolation defining layer 1005 may be removed by selective etching via the trench T1. Here, the etching may be have lateral characteristics, e.g. wet etching using the TMAH solution. The etching of the isolation defining layer 1005 (Si in this example) may stop at the sacrificial gates 1043 and 1045 (SiGe in this example).

Figure 15:
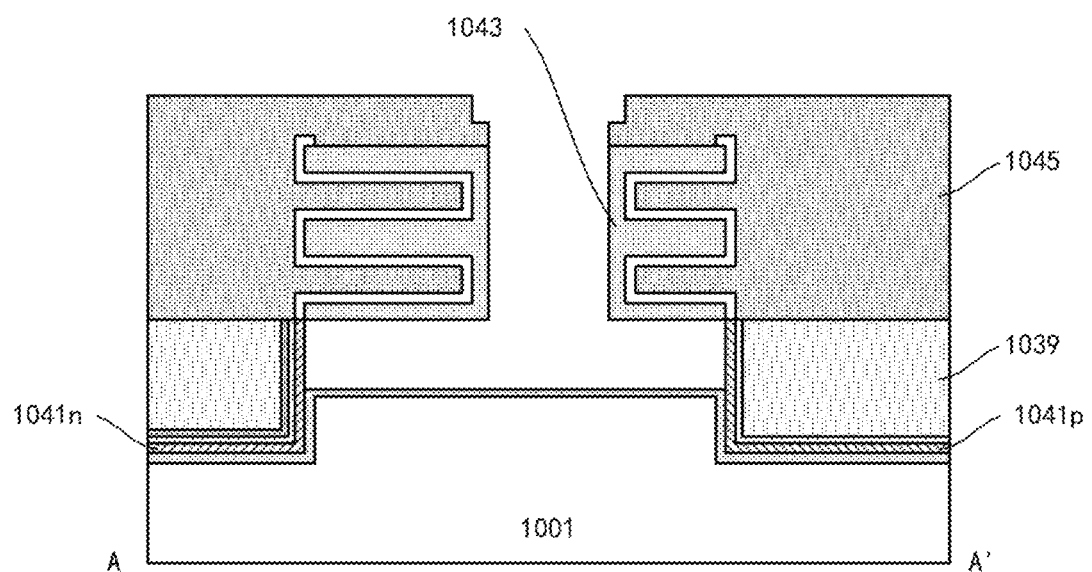

Currently, the sacrificial gate 1043 also extends on the lower surface of the semiconductor layer 1031, while the final formed gate stack only needs to surround the upper portion of the semiconductor layer 1031 (which serves as the channel portion). Here, a shape of the sacrificial gate 1043 may be adjusted to prevent the gate stack eventually replacing the sacrificial gate 1043 from extending onto the lower surface of the semiconductor layer 1031. For example, as shown in FIG. 15, the sacrificial gate 1043 may be etched back by selective etching. The etching back may remove the sacrificial gate 1043 from at least a portion of the surface of the PTS such that the at least portion of the surface of the PTS is exposed (and subsequently covered by the formed isolation layer). In addition, the sacrificial gate 1043 still surrounds the upper portion of the semiconductor layer 1031. To better control the amount of etch back, ALE may be used. In this example, the sacrificial gate 1045, which is also formed of SiGe, may also be affected by the etching back, resulting in a certain reduction in the thickness of the sacrificial gate 1045.

In the example of FIG. 15, the sacrificial gate 1043 is divided into upper and lower portions. The upper portion of the sacrificial gate 1043 surrounds the upper portion of the semiconductor layer 1031, and a bottom surface of the upper portion of the sacrificial gate 1043 is near (e.g. substantially flush with) the top surface of the isolation layer 1039. A top surface of the lower portion of the sacrificial gate 1043 is spaced apart from the bottom surface of the upper portion of the sacrificial gate 1043. An isolation layer will be formed between the top surface of the lower portion of the sacrificial gate 1043 and the bottom surface of the upper portion of the sacrificial gate 1043.

Figure 16:
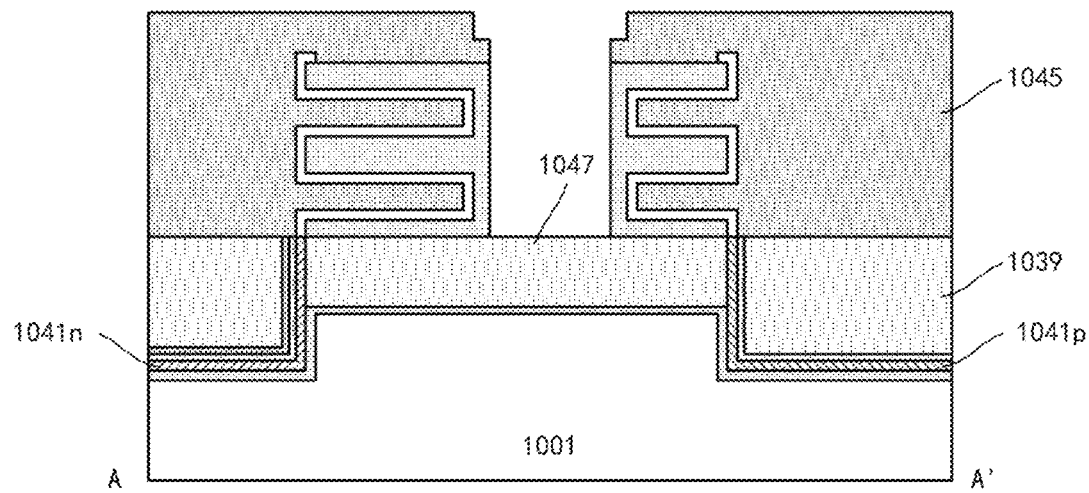

After that, as shown in FIG. 16, an isolation layer 1047 may be formed via the trench T1. The isolation layer 1047 may include the dielectric material, such as the same oxide as the isolation layer 1039. The formation of the isolation layer 1047 may include deposition followed by etching back. In order to ensure the filling performance, a method of repeated deposition followed by etching may be used, and atomic layer deposition (ALD) may be used for the deposition. The isolation layer 1047 may have a substantially flat top surface, and the top surface of the isolation layer 1047 may be located near (e.g. substantially flush with) the top surface of the isolation layer 1039.

In this way, the semiconductor layer 1031 extends upwardly in zigzag from the surface of the substrate 1001. The lower portion of the semiconductor layer 1031 is surrounded by the isolation layers 1039 and 1047. The upper portion of the semiconductor layer 1031 extends beyond the isolation layers 1039 and 1047 and is surrounded by the sacrificial gates 1043 and 1045 formed on the isolation layers. In this example, the top surface of the PTS formed in the semiconductor layer 1031 is shown to be substantially flush with the top surfaces of the isolation layers 1039 and 1047. However, the present disclosure is not limited thereto. For example, to ensure process margins, the top surface of the PTS is allowed to be slightly higher than the top surfaces of the isolation layers 1039 and 1047, e.g. due to the above-described upward diffusion.

Next, the gate replacement process may be performed.

Figure 17:
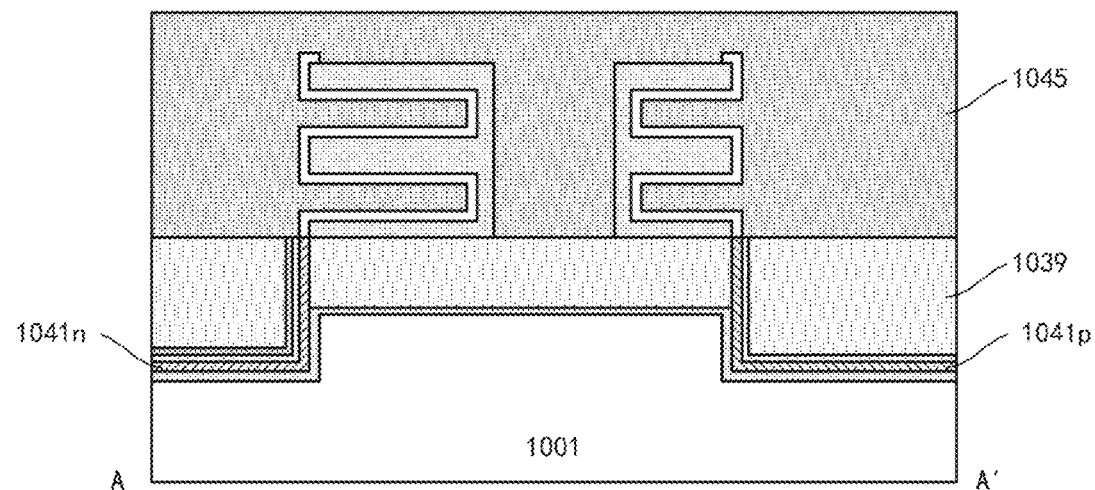

Currently, there are gaps in the sacrificial gates 1043 and 1045 due to the trench T1. To facilitate the gate replacement process, these gaps may be filled, for example, with a sacrificial gate material (in this example, SiGe), so that the sacrificial gate is integrated, thereby facilitating layout design of the sacrificial gate. For example, as shown in FIG. 17, the sacrificial gate material (in this example, is polycrystalline SiGe and thus is shown as being integral with the previous sacrificial gate 1045 and is still denoted as 1045) may be formed on the isolation layer 1047 via the trench T1. The formation of the sacrificial gate 1045 may include deposition followed by planarization such as CMP.

Figure 18A:
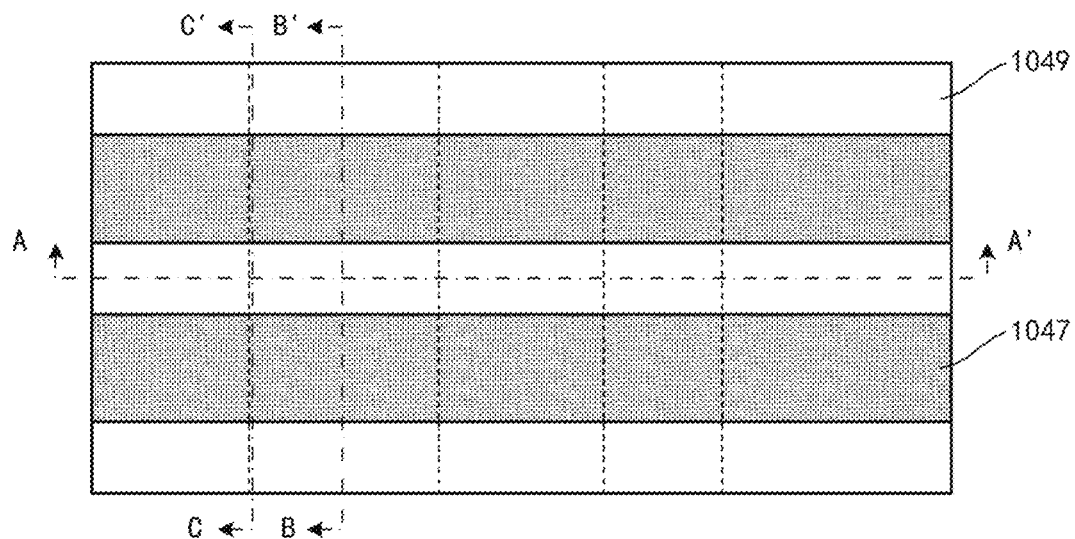
Figure 18B:
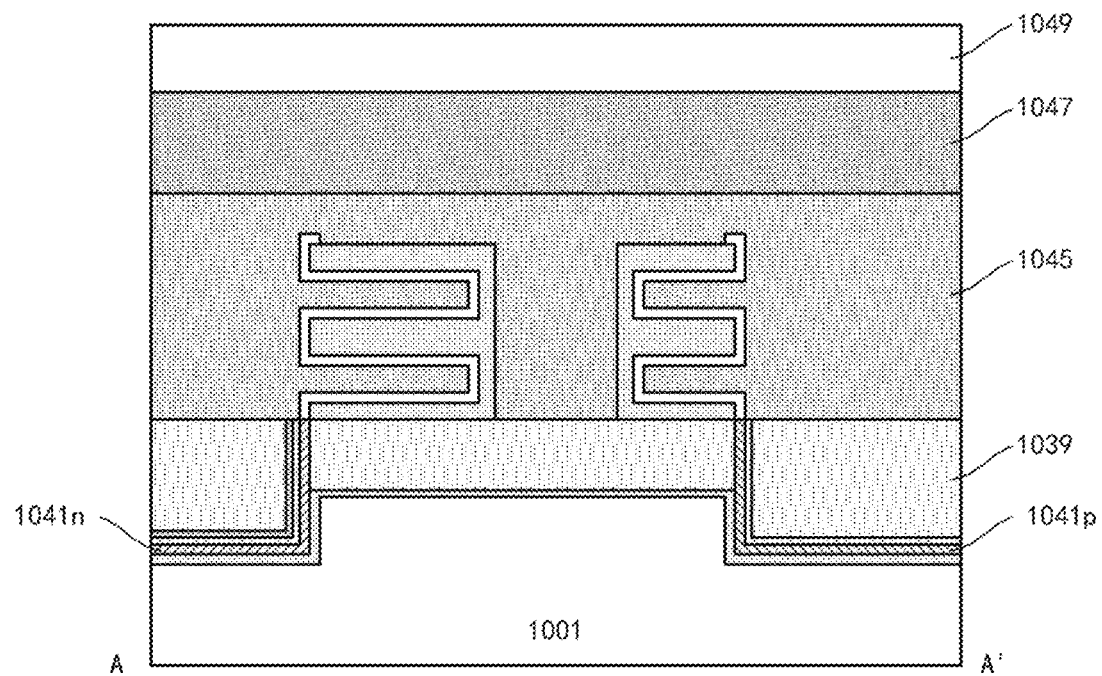
Figure 19A:
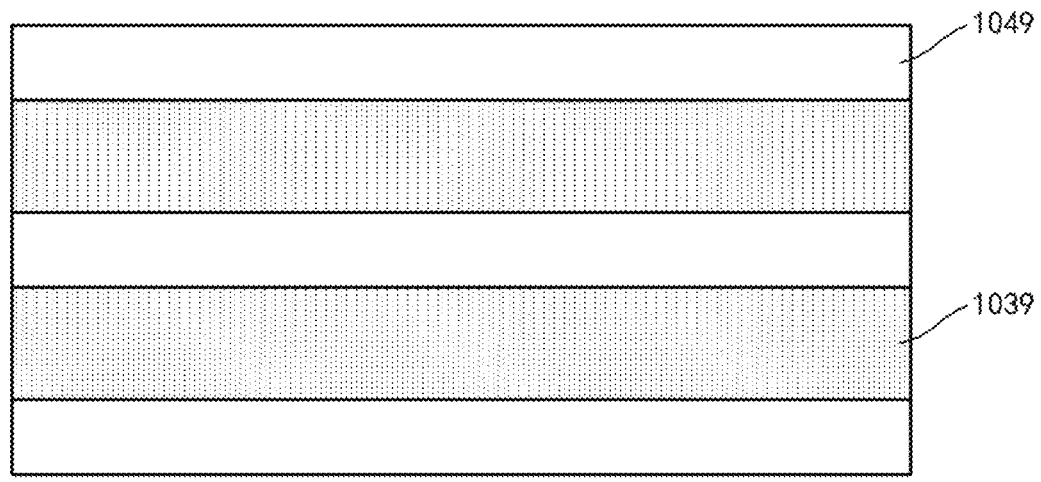
Figure 19B:
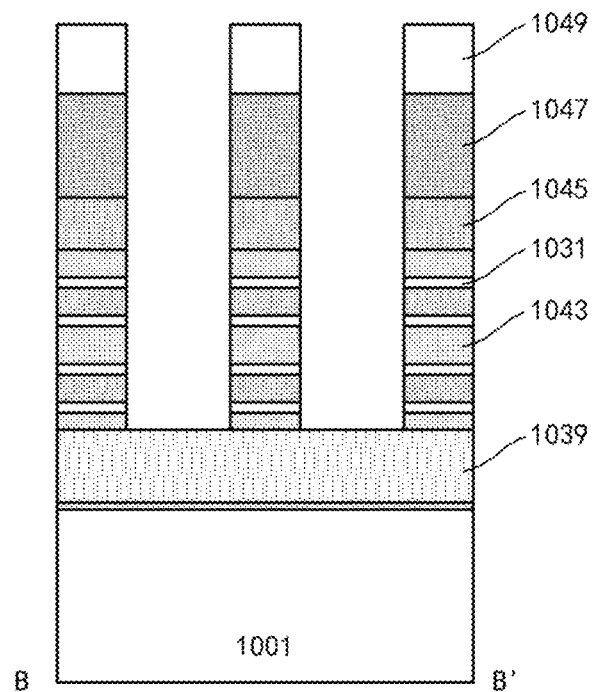
Figure 19C:
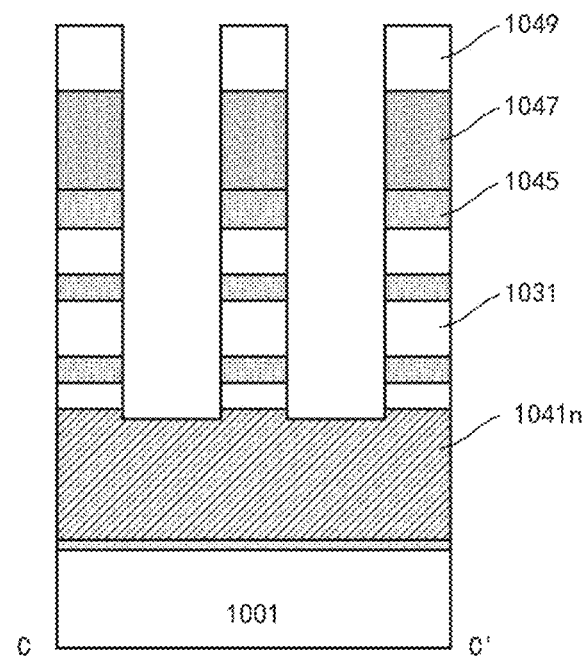

As shown in FIGS. 18(*a*) and 18(*b*), a hard mask layer 1047 may be formed, e.g. by deposition, on the sacrificial gates 1043 and 1045 to facilitate subsequent patterning of the sacrificial gate. For example, the hard mask layer 1047 may include nitride, with a thickness of, for example, about 50 nm to 150 nm. The sacrificial gates 1043 and 1045 may be patterned into the shape of the stripe extending in the second direction. To this end, a photoresist 1049 may be formed on the hard mask layer 1047 and patterned into the stripe shape extending in the second direction. Then, as shown in FIGS. 19(*a*), 19(*b*) and 19(*c*), selective etching, such as RIE, may be sequentially performed on the hard mask layer 1047, the sacrificial gates 1043 and 1045, and the semiconductor layer 1031 by using the photoresist 1049 as the mask. Accordingly, the sacrificial gates 1043 and 1045 may be patterned into the shape of the stripe extending in the second direction. The etching may be stopped at the isolation layers 1039 and 1047. Afterwards, the photoresist 1049 may be removed.

Figure 20A:
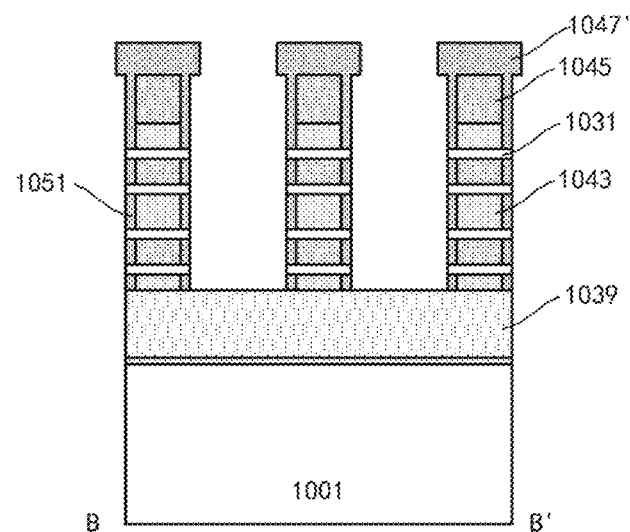
Figure 20B:
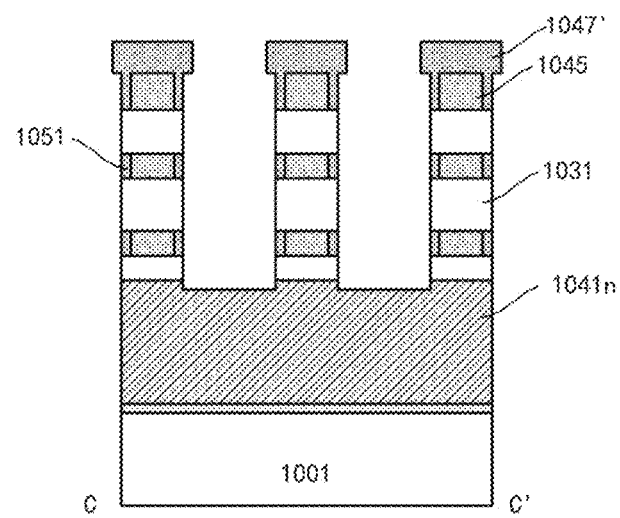

A gate spacer may be formed on sidewalls of the sacrificial gates 1043 and 1045. For example, as shown in FIGS. 20(*a*) and 20(*b*), the sacrificial gates 1043 and 1045 may be recessed (with respect to the semiconductor layer 1031) to a certain depth in the lateral direction by selective etching, e.g. a depth of about 2 nm to 7 nm. Atomic layer etching (ALE) may be used to control the recess depth. A dielectric material may be filled in the formed recess to form a gate spacer 1051. Such filling may formed, for example, by depositing nitride with a thickness of about 3 nm to 10 n, and then performing RIE to the deposited nitride (until the surface of the semiconductor layer 1031 is exposed). Here, the hard mask layer 1047, which is also formed of nitride, may become integral with the gate spacer on the sidewalls of the sacrificial gates 1043 and 1045 and thus is denoted as 1047'.

According to such process, the gate spacer 1051 may be formed on the sidewalls of the sacrificial gates 1043 and 1045 and be self-aligned with the sidewalls of the sacrificial gates 1043 and 1045, while the gate spacer 1051 is not formed on the sidewalls of the semiconductor layer 1031. The gate spacer 1051 may have a substantially uniform thickness, which depends, for example, on the depth of the aforementioned recess. In addition, outer sidewalls of the gate spacer 1051 and outer sidewalls of the semiconductor layer 1031 may be substantially aligned in the vertical direction. Inner sidewalls of the gate spacer 1051 may be substantially aligned in the vertical direction (it is achieved by controlling the etching depth of respective recesses to be substantially the same when forming the recesses).

After that, source/drain portions contacting the sidewalls of the semiconductor layer 1031 may be formed on two sides of the sacrificial gates 1043 and 1045.

Figure 21A:
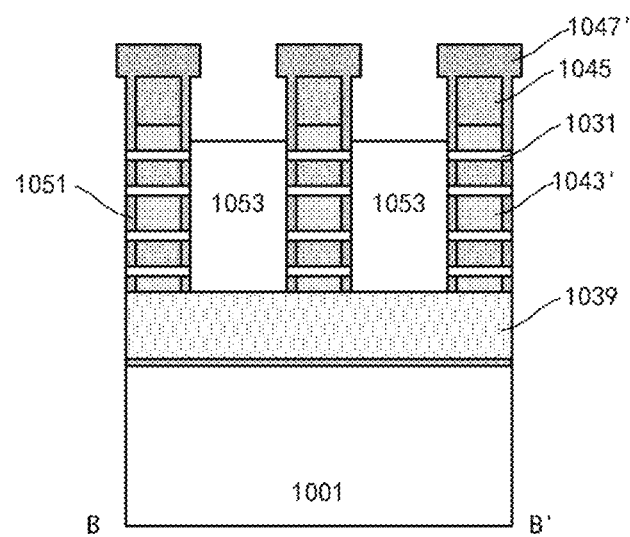
Figure 21B:
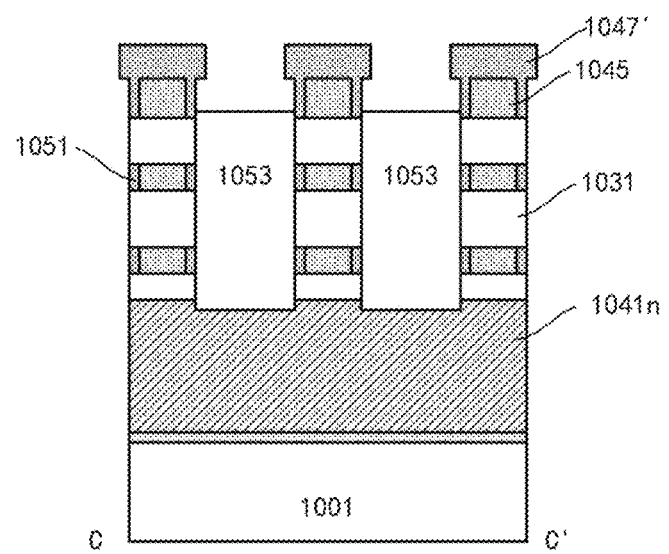

As shown in FIGS. 21(*a*) and 21(*b*), source/drain portions 1053 may be formed by, for example, epitaxial growth. The source/drain portions 1053 may be grown from the exposed sidewalls of the semiconductor layer 1031. The grown source/drain portions 1053 are in contact with the sidewalls of the semiconductor layer 1031. When being grown, the source/drain portions 1053 may be in-situ doped to have a conductivity type corresponding to a device to be formed, e.g. n-type for an n-type device and p-type for a p-type device. A doping concentration may be about 1E19 cm$^{-3}$ to 1E21 cm$^{-3}$. The grown source/drain portions 1053 may have a material (e.g. having a different lattice constant) different from a material of the semiconductor layer 1031 in order to apply stress to the semiconductor layer 1031. For example, the source/drain portions 1053 may include Si:C (for example, with an atomic percent of C being about 0.1% to 5%) for the n-type device. The source/drain portions 1053 may include SiGe (for example, with an atomic percent of Ge being about 20% to 75%) for the p-type device. In a case where the n-type device and the p-type device are both formed on the substrate, the source/drain portions for the n-type device may be grown separately for the source/drain portions for the p-type device. When growing the source/drain portions of one type of device, a region of the other type of device may be shielded by a shielding layer such as the photoresist or the like.

Figure 22A:
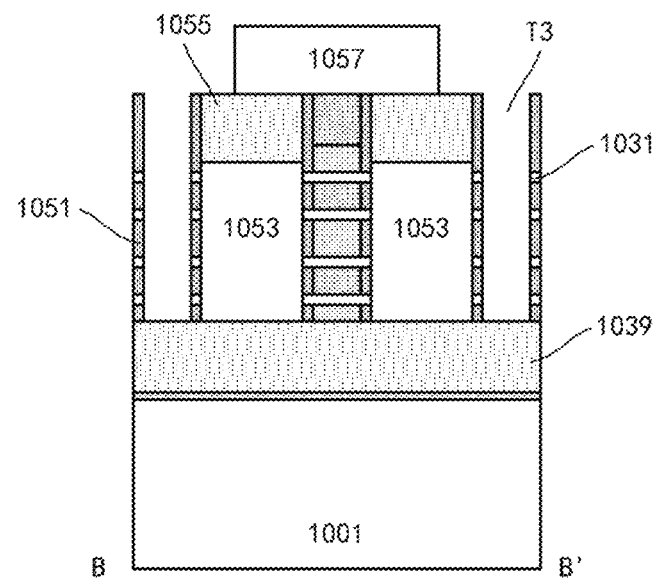
Figure 22B:
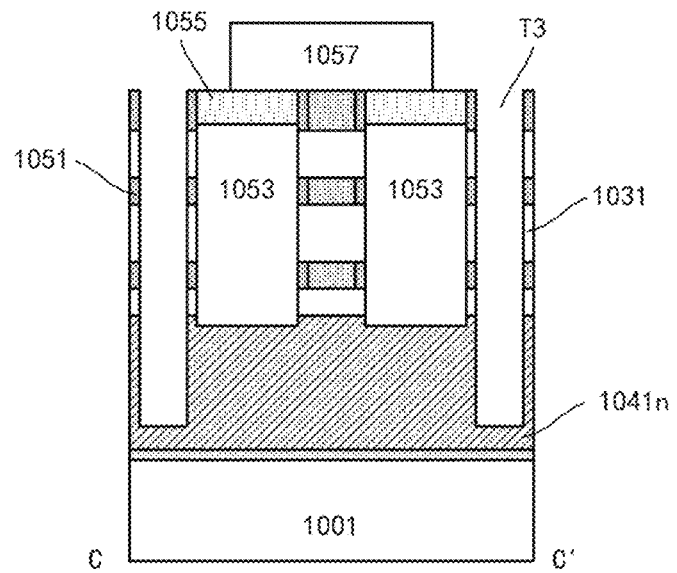
Figure 22C:
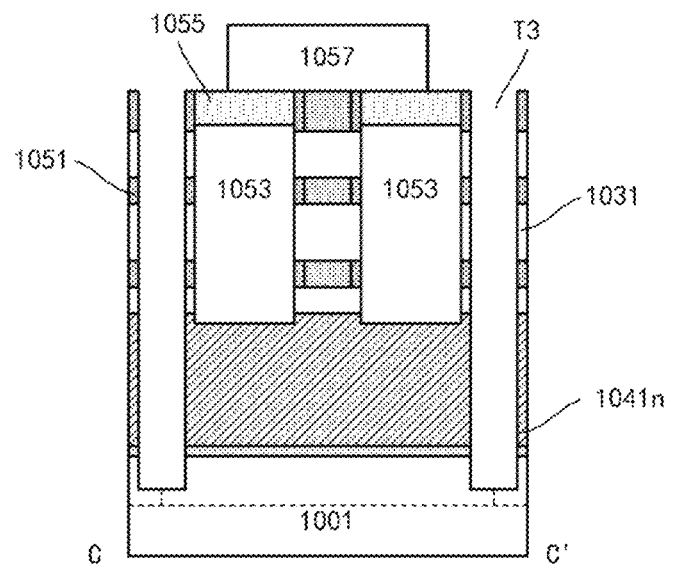

There are gaps between the strip-shaped sacrificial gates in addition to the grown source/drain portions 1053. A dielectric material may be filled in such gaps to form an interlayer dielectric layer. For example, as shown in FIGS. 22(*a*) and 22(*b*), an interlayer dielectric layer 1055 may be formed, e.g. by deposition followed by planarization (until the sacrificial gate is exposed). For example, the interlayer dielectric layer 1055 may include oxide.

Currently, opposite sides of the same source/drain portion 1053 are both connected to the semiconductor layers 1031. That is, devices on opposite sides of the source/drain portion 1053 are now electrically connected with each other. Depending on the design layout, the electrical isolation may be performed between the devices.

For example, a photoresist 1057 may be formed on the interlayer dielectric layer 1055 and patterned to shield one or more sacrificial gates and expose other sacrificial gates. In this example, a sacrificial gate in the middle is shielded, while sacrificial gates on two sides are exposed. The exposed sacrificial gate and the semiconductor layer 1031 below the exposed sacrificial gate may be selectively etched in sequence by, for example, RIE, so that a space T3 is formed between the gate spacers 1051. Here, the etching may enter the lower portion of the semiconductor layer 1031 (e.g. in the PTS) to ensure the electrical isolation. Afterwards, the photoresist 1057 may be removed.

According to some embodiments, a well region may be formed in the substrate 1001 (see the dashed line in FIG. 22(*c*)). The devices are respectively formed on corresponding well regions. For example, the n-type device may be formed on a p-type well region. The p-type device may be formed on an n-type well region. When the n-type device is adjacent to the p-type device, a pn junction may be formed between their corresponding well regions. The leakage of the pn junction in SiGe material is larger than that in Si material. According to other embodiments of the present disclosure, as shown in FIG. 22(*c*), the space T3 between the gate spacers 1051 may further extend into the substrate 1001, so that the SiGe layer is cut between adjacent devices to further improve an isolation performance.

Figure 23A:
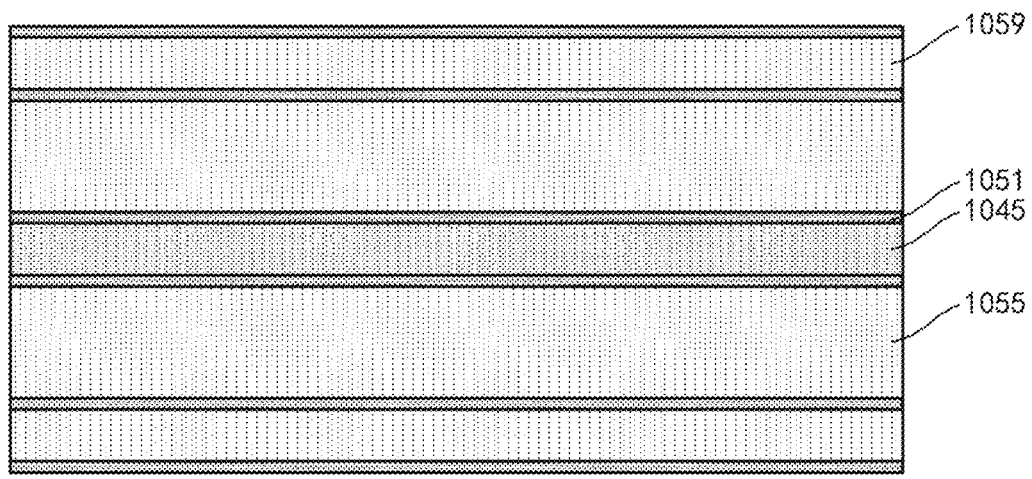
Figure 23B:
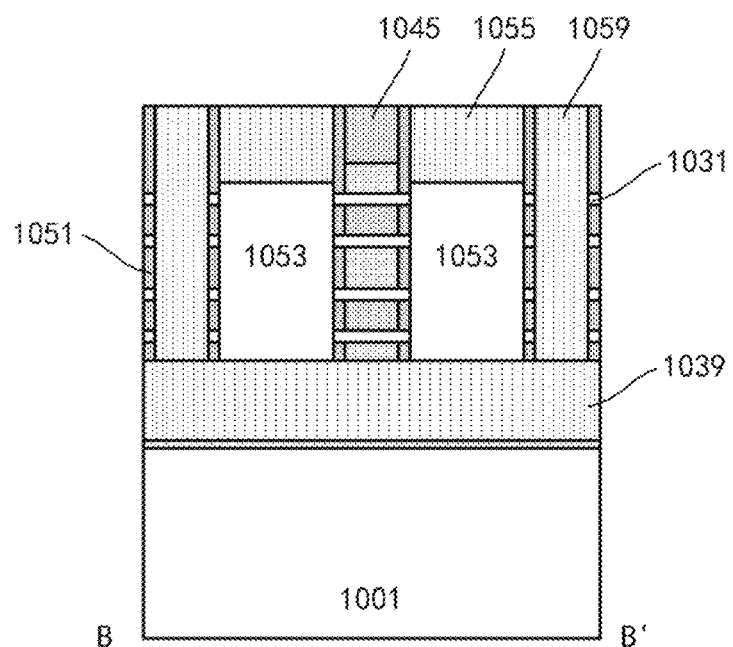
Figure 23C:
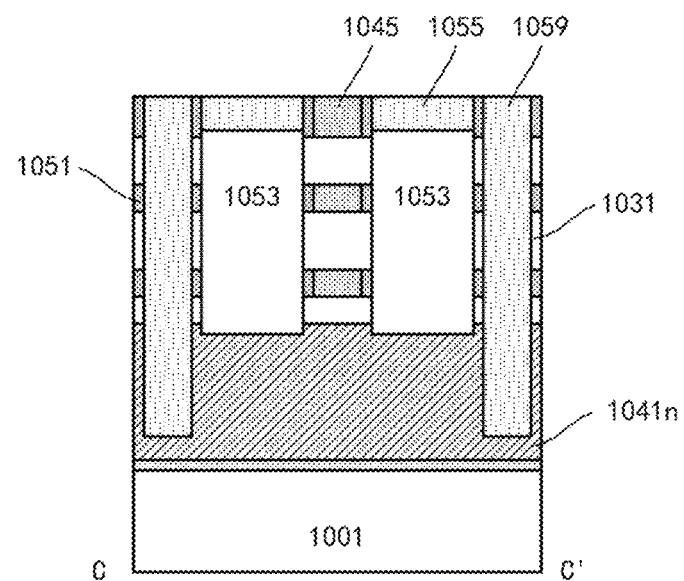

As shown in FIGS. 23(*a*), 23(*b*) and 23(*c*), the dielectric material such as oxide may be filled in the space T3 to form an isolation portion 1059 between the devices. Such filling may include deposition followed by planarization. The isolation portion 1059 may extend between the spacers 1051. The spacers 1051 on two sides of the isolation portion 1059 are no longer used to define the gate stack, and thus may be called as dummy gate spacers.

It should be pointed out that whether or not to form the isolation portion and between which devices the isolation portion is to be formed depends on the circuit design.

Next, the sacrificial gates 1043 and 1045 may be replaced with the gate stack to complete device manufacture.

Figure 24A:
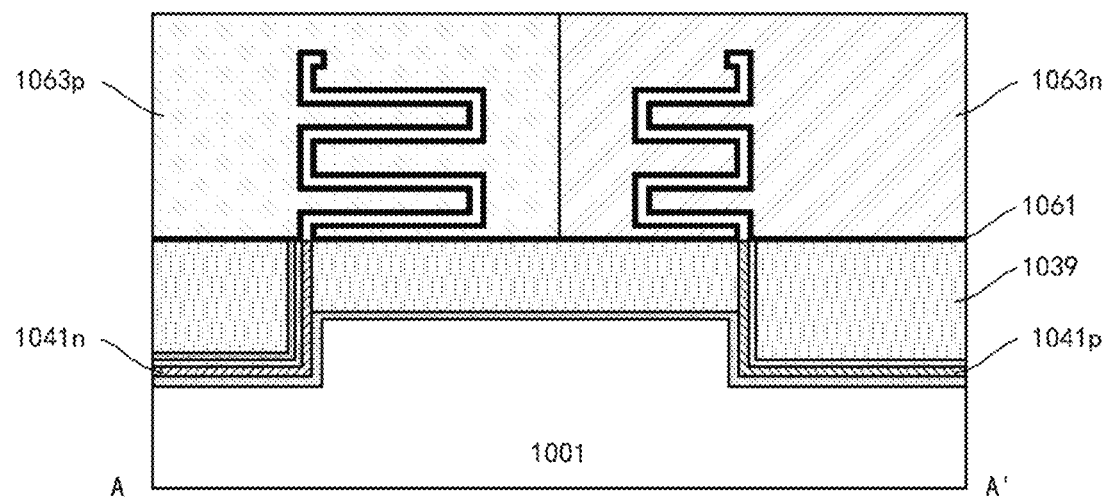
Figure 24B:
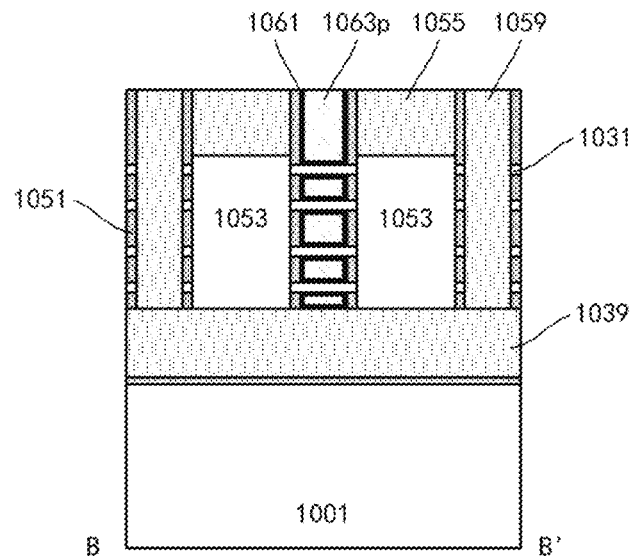
Figure 24C:
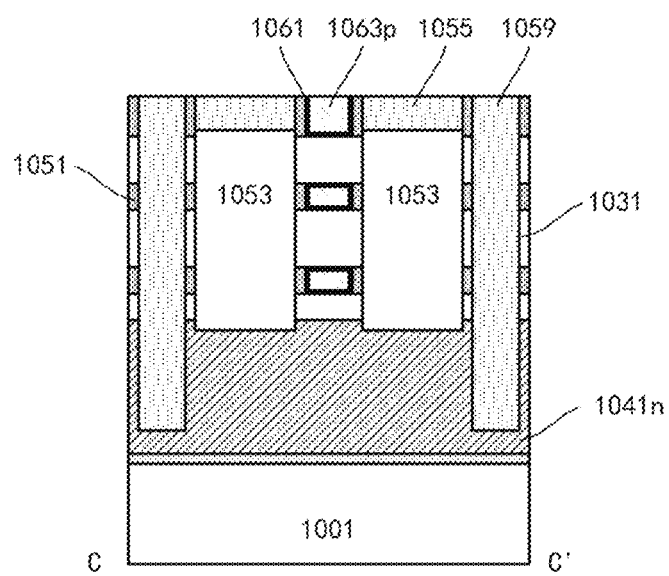

For example, as shown in FIGS. 24(a), 24(b) and 24(c), the sacrificial gates 1043 and 1045 may be removed by selective etching (as described above, the different portions formed in the sacrificial gates 1043 and 1045 may include similar or the same material, such as the single crystal SiGe or the polycrystalline SiGe, and may be etched by the same etching recipe), thereby forming a gate trench inside the gate spacer 1051. The gate stack may be formed in the gate trench. For example, a gate dielectric layer 1061 and gate conductor layers 1063p and 1063n may be sequentially deposited in the gate trench. The gate dielectric layer 1061 may be formed in a substantially conformal manner. The gate dielectric layer 1061 may have a thickness of, for example, about 2 nm to 5 nm, and may include a high-k gate dielectric such as $HfO_2$. Before forming the high-k gate dielectric, an interface layer may further be formed. For example, the interface layer may be formed of oxide which is formed by an oxidation process or deposition such as atomic layer deposition (ALD) and has a thickness of about 0.2 nm to 2 nm. The gate conductor layers 1063p and 1063n may include a work function adjusting metal such as TiN, TaN, etc., and a gate conductive metal such as W or the like. The deposited gate dielectric layer 1041 and the gate conductor layers 1063p and 1063n may subject to planarization, such as CMP, so as to be left within the gate trench.

In this example, both the p-type device and the n-type device are formed on the substrate, and a gate stack of the p-type device and a gate stack of the n-type device may be formed separately. For example, the gate stack of the p-type device has a work function different from the work function of the gate stack of the n-type device. For example, after a first gate stack for one type of device is formed, a region of the device may be shielded by the shielding layer such as the photoresist. A first gate stack existing in a region of another type of device may be removed (it is possible to remove only the gate conductive layer). Then a second gate stack for another type of device is formed. Here, an example is shown in which the p-type device and the n-type device respectively include different gate conductor layers 1063p and 1063n.

As shown in FIG. 24(a), the current p-type and n-type devices have respective gate conductor layers connected to each other. The gate conductor layer may be adjusted according to the layout design.

Figure 25A:
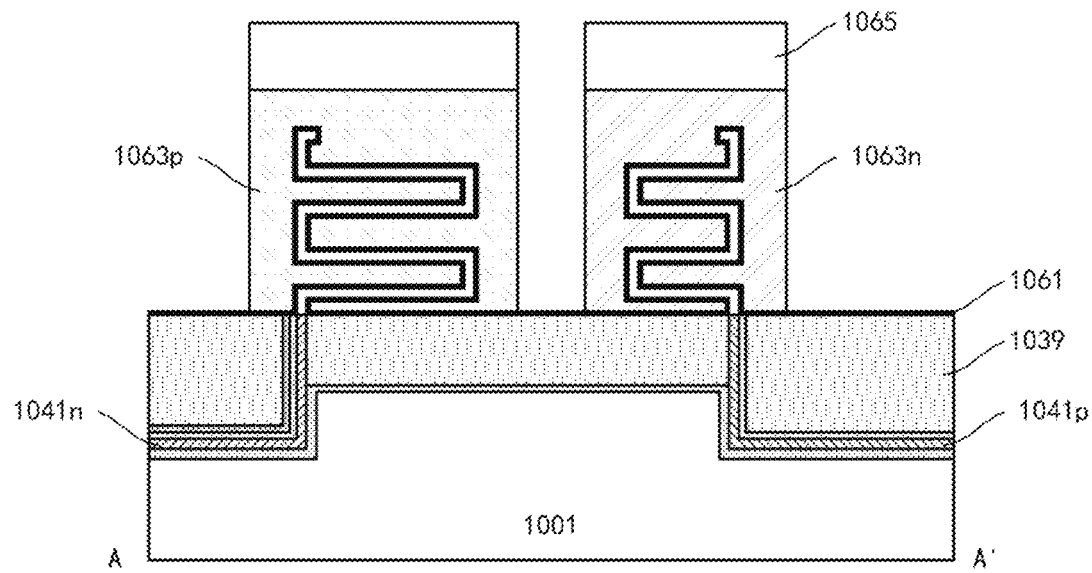
Figure 25B:
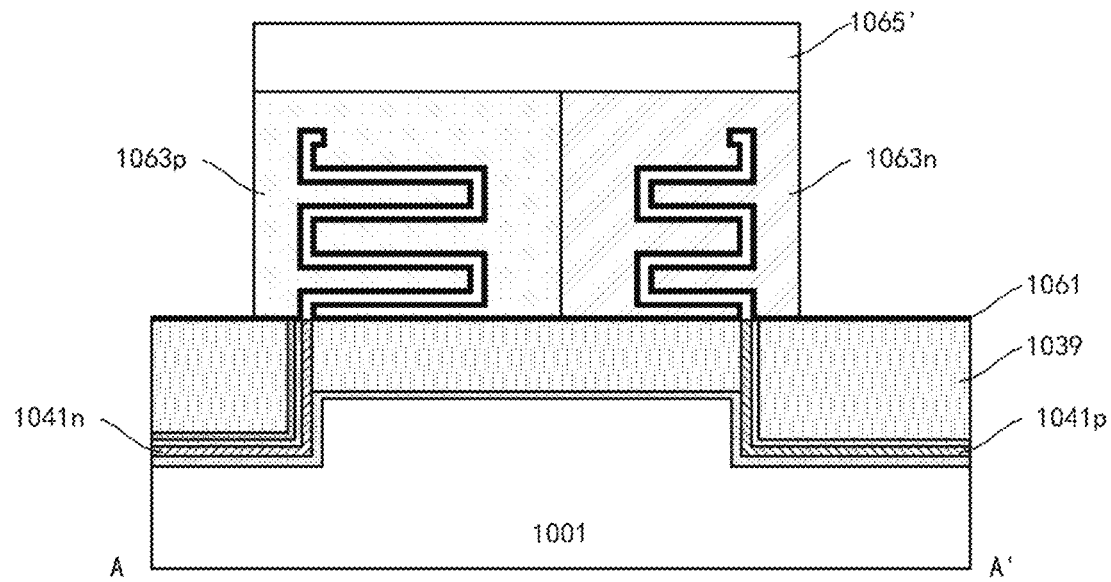

For example, as shown in FIG. 25(a), a photoresist 1065 may be used to separate the gate conductor layer 1063p of the p-type device from the gate conductor layer 1063n of the n-type device to achieve an electrical isolation between the gate conductor layer 1063p and the gate conductor layer 1063n. Alternatively, as shown in FIG. 25(b), the gate conductor layer 1063p of the p-type device and the gate conductor layer 1063n of the n-type device may be patterned to be connected to each other using a photoresist 1065' (so that the p-type device and the n-type device may form the CMOS configuration), and may be separated from gate conductor layers of other surrounding devices.

Figure 26A:
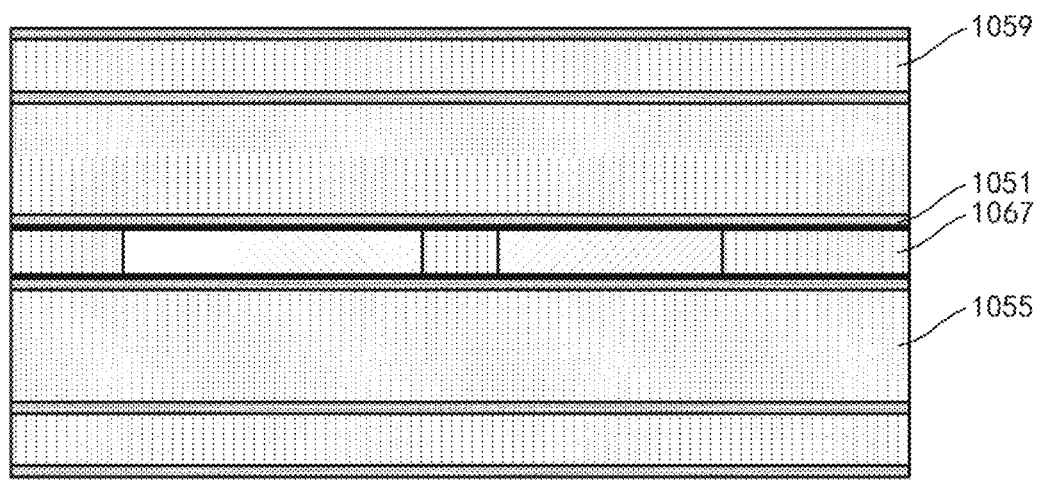
Figure 26B:
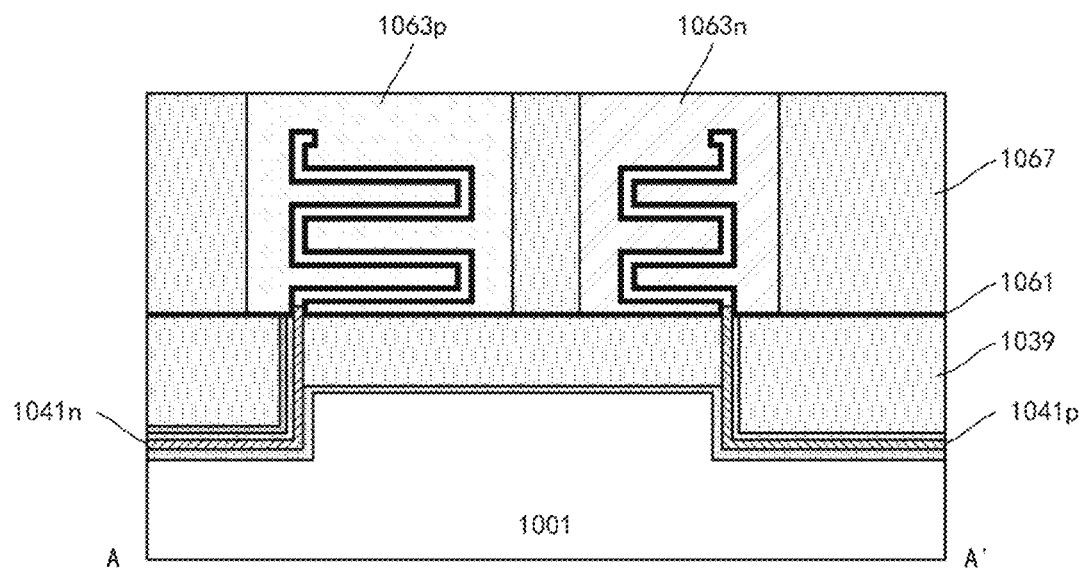

The dielectric material may be filled in the gaps due to the adjustment of the gate conductor layer to achieve electrical isolation. As shown in FIGS. 26(a) and 26(b), an interlayer dielectric layer 1067 may be formed by, for example, deposition followed by planarization such as CMP. The interlayer dielectric layer 1067 for example, may include oxide.

As shown in FIG. 26(b), the semiconductor device according to an embodiment of the present disclosure may include the semiconductor layer 1031 extending upwardly in zigzag from the substrate. Specifically, the semiconductor layer 1031 may include the first portion (e.g. extending generally laterally with respect to the substrate 1001) and the second portions (e.g. extending generally vertically with respect to the substrate 1001) respectively disposed at opposite ends of the first portion. The second portions at opposite ends of the same first portion respectively extend in opposite directions (e.g. upward and downward, respectively) from the first portion, so as to form a zigzag extending shape.

As described above, such semiconductor layer 1031 is defined by the comb-shaped structure. The number of the first portion of the semiconductor layer 1031 is variable, e.g. one or more, depending on the number of comb teeth in the comb-shaped structure. When there is a plurality of first portions of the semiconductor layer 1031, the first portions may be spaced apart from each other, and adjacent first portions are connected to each other through a corresponding second portion.

In the example shown in FIG. 26(b), for the two devices, the width of the first portion of one device may be different from the width of the first portion of the other one device. Thus, a channel width of one device may be different from a channel width of the other device, although top surfaces of channel portions of the two devices are at substantially the same height with respect to the top surface of the substrate 1001. However, in the conventional FinFET, fins with different heights need to be provided in order to achieve different channel widths.

In addition, as shown in FIG. 26(b), the top surfaces of the PTSs 1041n and 1041p extend beyond the top surfaces of the isolation layers 1039 and 1047. As mentioned above, this may better ensure a punch-through stopping effect.

In the above embodiments, the isolation layer is formed by replacing the isolation defining layer with the dielectric material. However, the present disclosure is not limited thereto. For example, isolation may be achieved using a PTS-like approach to simplify the process.

FIGS. 27 to 40 are schematic views showing some stages in a process of manufacturing a semiconductor device according to another embodiment of the present disclosure. Hereinafter, differences from the above-described embodiments will be mainly described.

Figure 27:
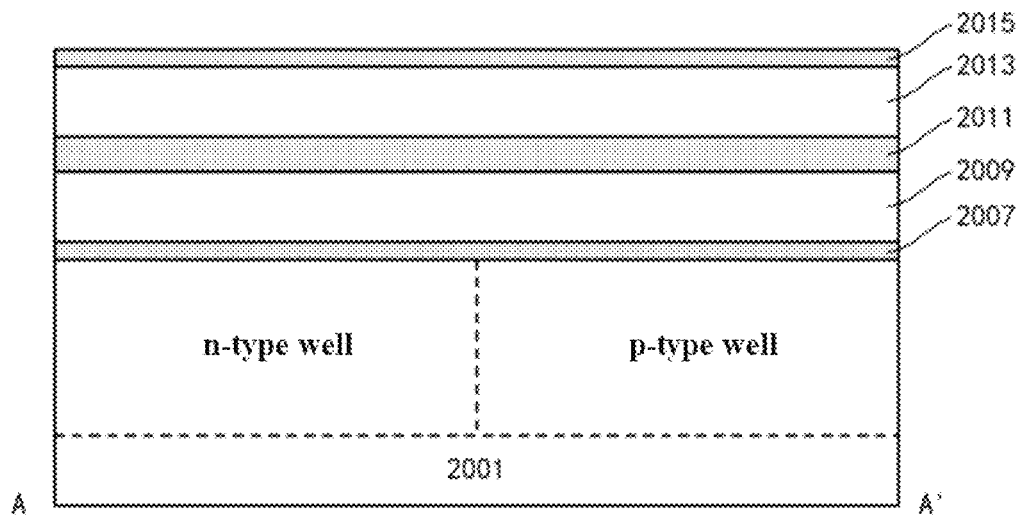
FIGS. 27 to 40 are schematic views showing some stages in a process of manufacturing a semiconductor device according to another embodiment of the present disclosure, wherein FIGS. 1 to 6, 7(*a*), 7(*b*), 8 to 17, 18(*b*), 24(*a*), 25(*a*), 25(*b*), 26(*b*), and 27 to 40 are cross-sectional views taken along line AA'.

As shown in FIG. 27, a substrate 2001, such as a silicon wafer, is provided. Regarding the substrate 2001, reference may be made to the above description regarding the substrate 1001.

In the substrate 2001, a well region may be formed by, for example, ion implantation. For example, an n-type well may be formed by implanting an n-type dopant such as As or P in a p-type device region where the p-type device need to be formed (a left region in the figure). A p-type well may be formed by implanting a p-type dopant such as B or $BF_2$ in an n-type device region where the n-type device need to be formed (the left region in the figure). Annealing may be performed to activate the implanted ions. The doping concentration in the well region may be, for example, about $1E17$ $cm^{-3}$ to $2E19$ $cm^{-3}$. Such well region may function similarly to the PTS described above, and thus may also be referred to as the PTS.

On the substrate 2001, a stack of first sacrificial layers 2007, 2011 and 2015 alternated with second sacrificial layers 2009 and 2013 may be formed, e.g. by epitaxial growth. Regarding these sacrificial layers, for example, reference may be made to the above description of the first sacrificial layers 1007, 1011 and 1015 and the second sacrificial layers 1009 and 1013. In this example, the middle first sacrificial layer 2011 is formed thicker in order to provide a larger space for the gate stack to be formed later.

Figure 28:
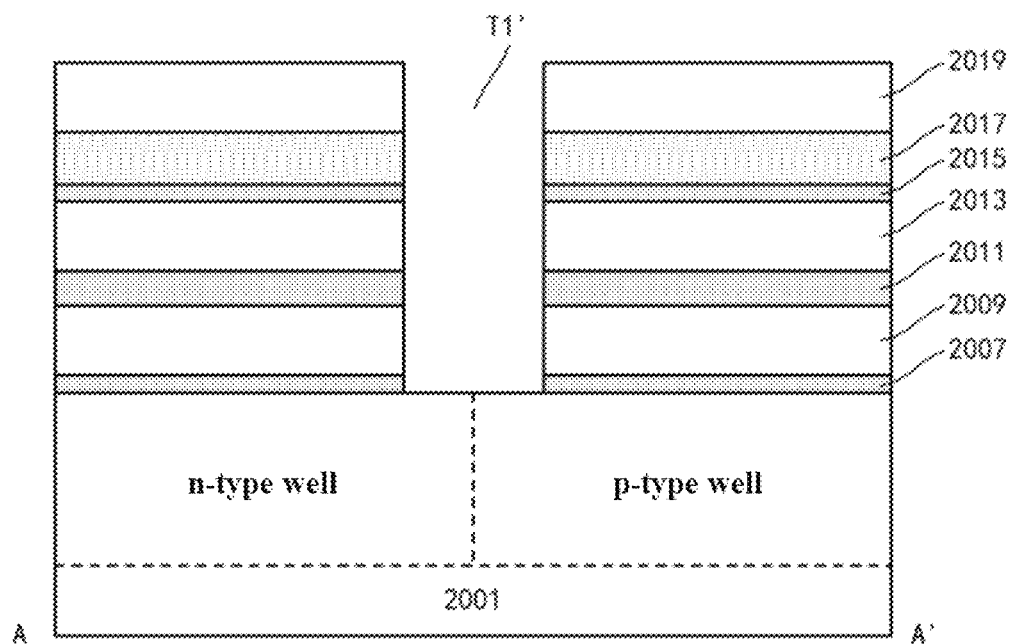

As shown in FIG. 28, a trench T1′ may be formed in the stack. As described above in connection with FIG. 2, a hard mask layer 2017 (e.g. oxide) and a photoresist 2019 may be formed for forming the trench T1′. Etching such as RIE to form the trench T1′ may stop at the substrate 2001. Afterwards, the photoresist 2019 may be removed.

Figure 29:
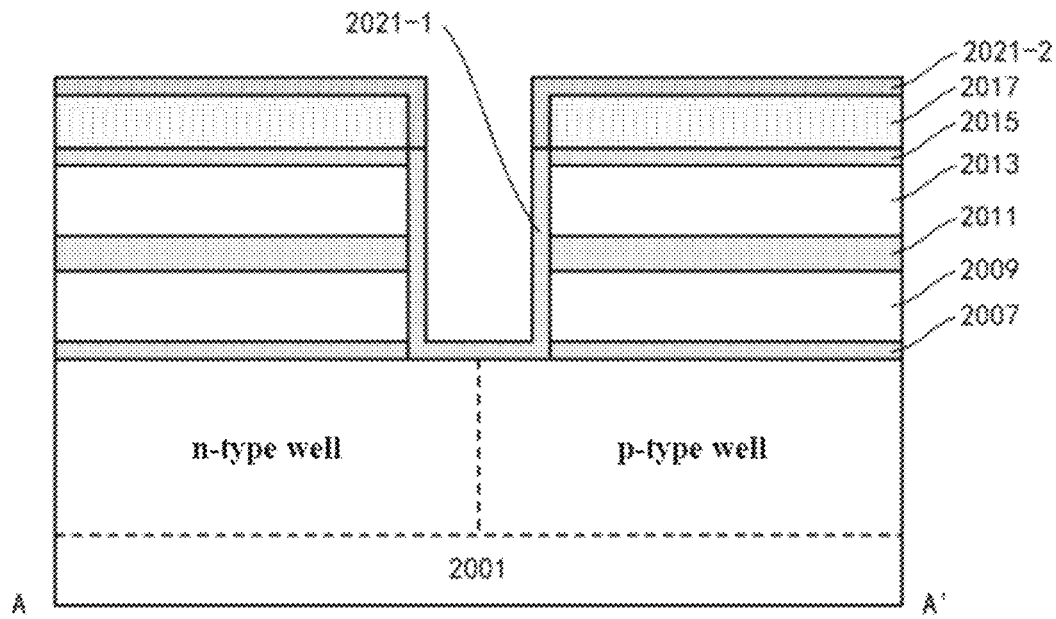

As shown in FIG. 29, a third sacrificial layer 2021-1 may be formed on sidewalls (and a bottom surface) of the trench T1′ by, for example, epitaxial growth. Additionally, the growth may also occur on a surface of the hard mask layer 2017, thereby forming a material layer 2021-2. Regarding the third sacrificial layer 2021-1 and the material layer 2021-2, reference may be made to the above descriptions regarding the third sacrificial layer 1021-1 and the material layer 1021-2.

Figure 30:
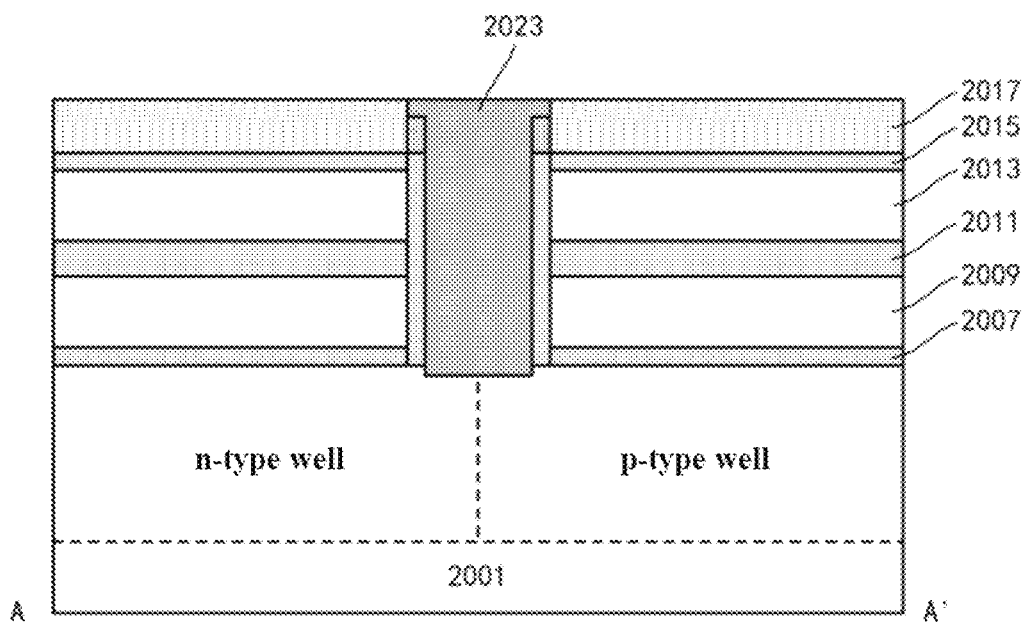

As shown in FIG. 30, the third sacrificial layer 2021-1 and the material layer 2021-2 may be formed in the form of the spacer. A support portion 2023 may be formed in the trench T1′. For this, reference may be made to the above description in conjunction with FIG. 4 for example.

Figure 31:
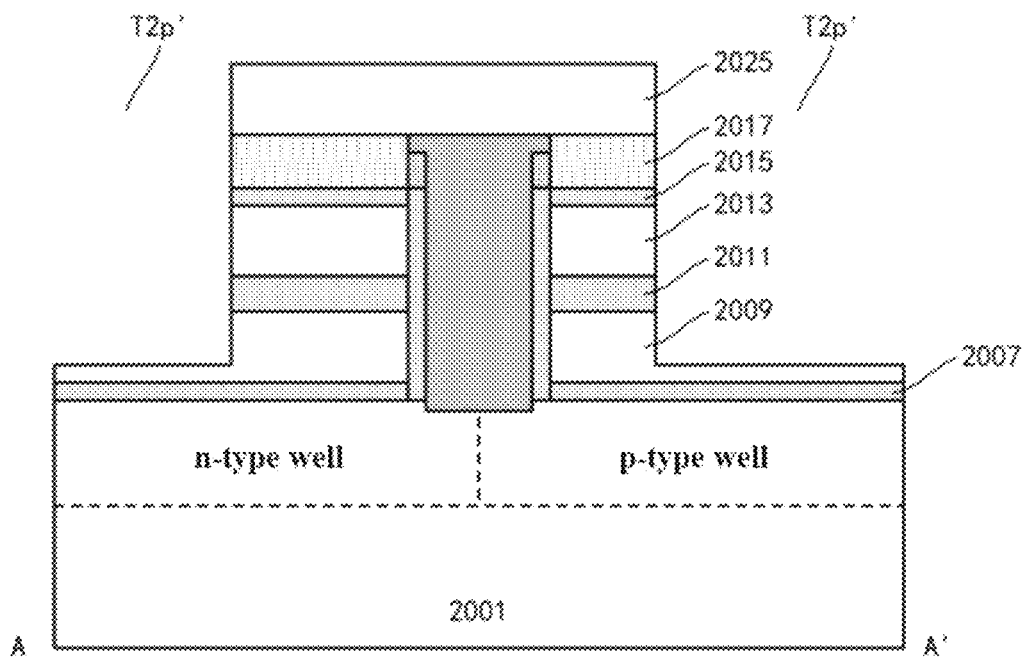

As shown in FIG. 31, the widths of the first sacrificial layers 2007, 2011 and 2015 may be adjusted by using a photoresist 2025. For this, reference may be made to the above description in conjunction with FIG. 5 for example. Here, both the substrate 2001 and the second sacrificial layers 2009 and 2013 include Si. In order to prevent the substrate 2001 from being adversely affected by the removal of the second sacrificial layers 2009 and 2013, the etching using the photoresist 2025 as the mask may be proceed to the bottom second sacrificial layer 2009, but not proceed to the bottom first sacrificial layer 2007 (which may protect the substrate 2001 in the process of removing the second sacrificial layers 2009 and 2013), thereby forming a preparatory trench T2p′.

Figure 32:
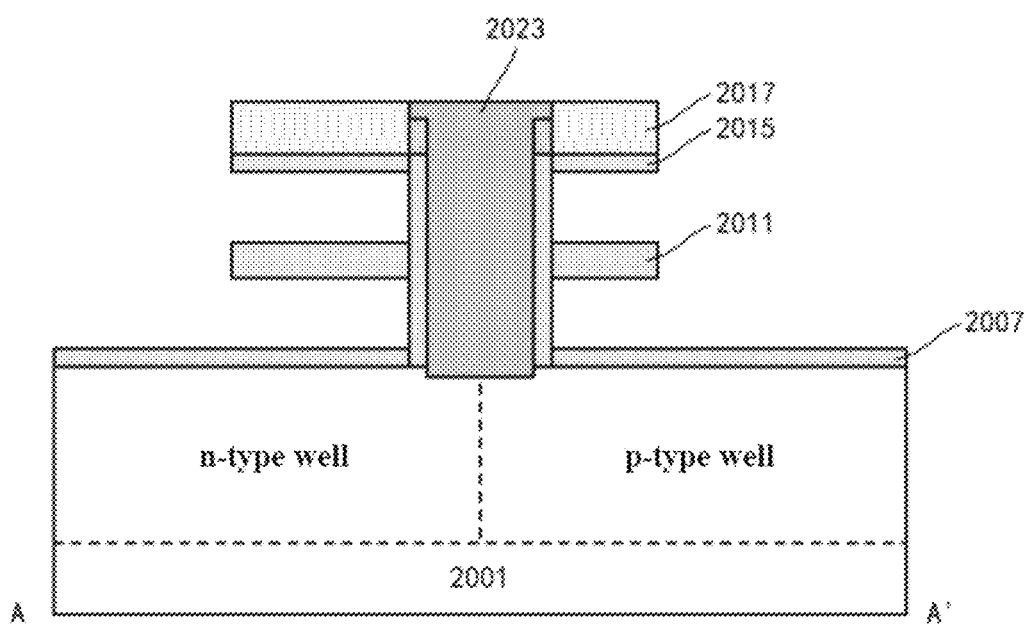

As shown in FIG. 32, the second sacrificial layers 2009 and 2013 may be removed via the preparatory trench T2p′. For this, reference may be made to the above description in conjunction with FIG. 6 for example.

Figure 33:
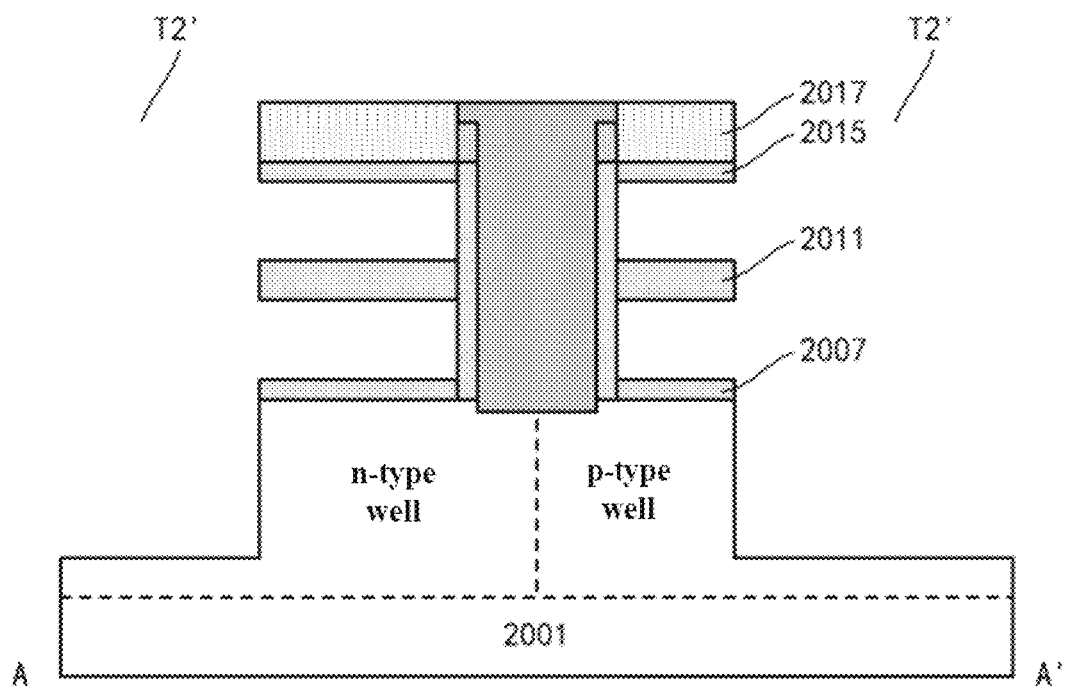

As shown in FIG. 33, the width adjustment of the first sacrificial layer 2007 may be continued. For this, for example, reference may be made to the above description in conjunction with FIGS. 7(a) and 7(b). Here, the preparatory trench T2p′ is deepened and enters the substrate 2001. Specifically, the preparatory trench T2p′ enters a well region in the substrate 2001 to form a trench T2′.

Figure 34:
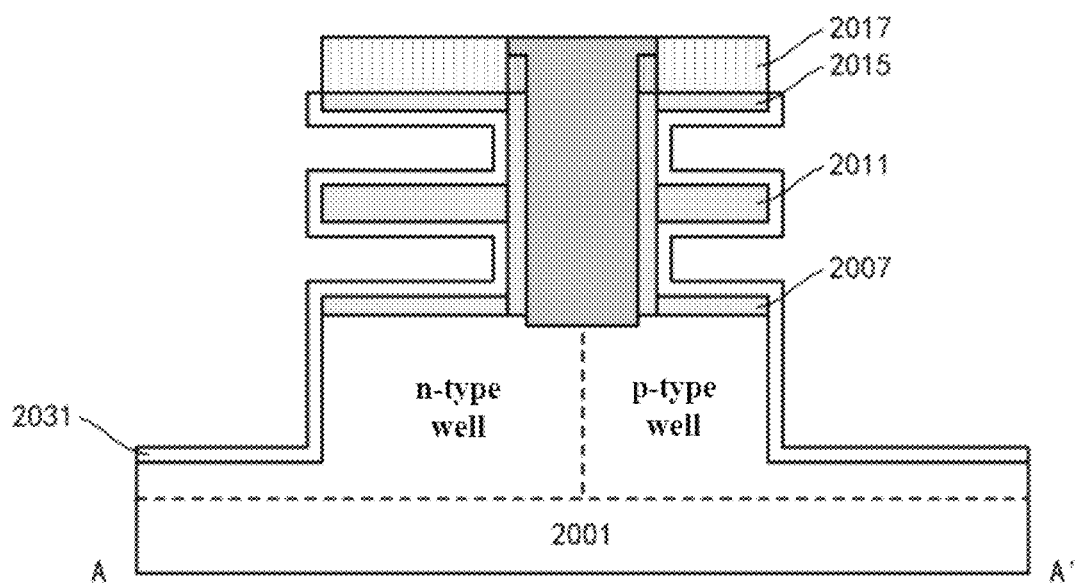

As shown in FIG. 34, a semiconductor layer 2031 may be grown on a surface of a comb-shaped structure exposed through the trench T2′. For this, reference may be made to the above description in conjunction with FIG. 8 for example. In this example, since the operation of replacing the isolation defining layer with the isolation layer does not exist in the subsequent process, it is not required to form the etching stop layer 1029 described above.

Figure 35:
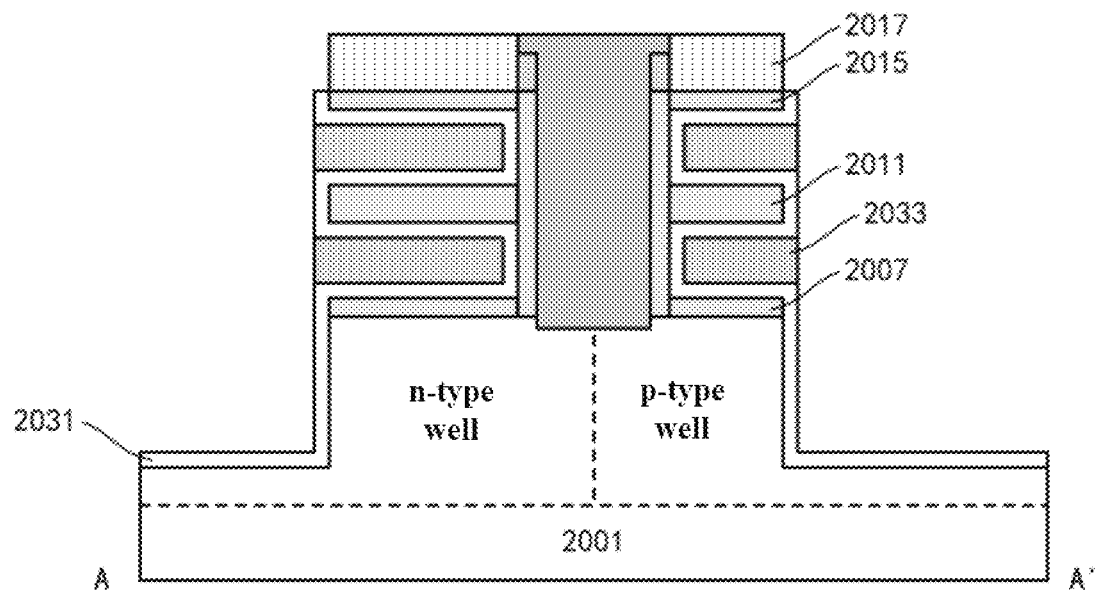

As shown in FIG. 35, a protective layer 2033 may be filled in gaps of the comb-shaped structure. For this, reference may be made to the description above in conjunction with FIGS. 9 and 10 for example.

Figure 36:
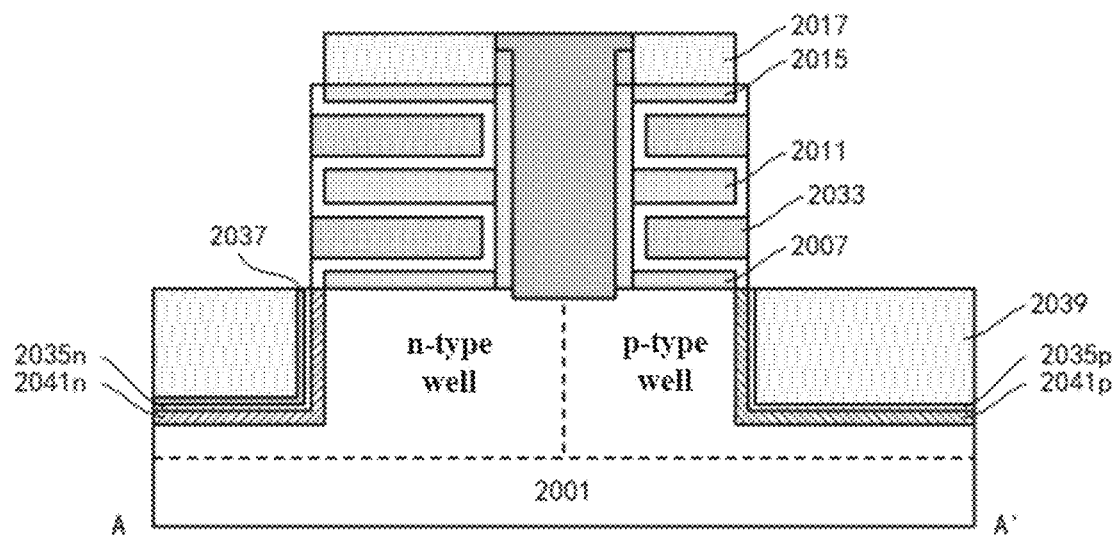

As shown in FIG. 36, PTSs 2041n and 2041p may be formed in the semiconductor layer 2031 by solid phase doping, e.g. by a first dopant source layer 2035n and a second dopant source layer 2035p. For this, reference may be made to the above description in conjunction with FIGS. 11 to 13. As described above, an isolation layer 2039 is formed in order to define a range of solid-phase doping. In addition, a barrier layer 2037 is further formed to avoid cross-contamination.

Figure 37:
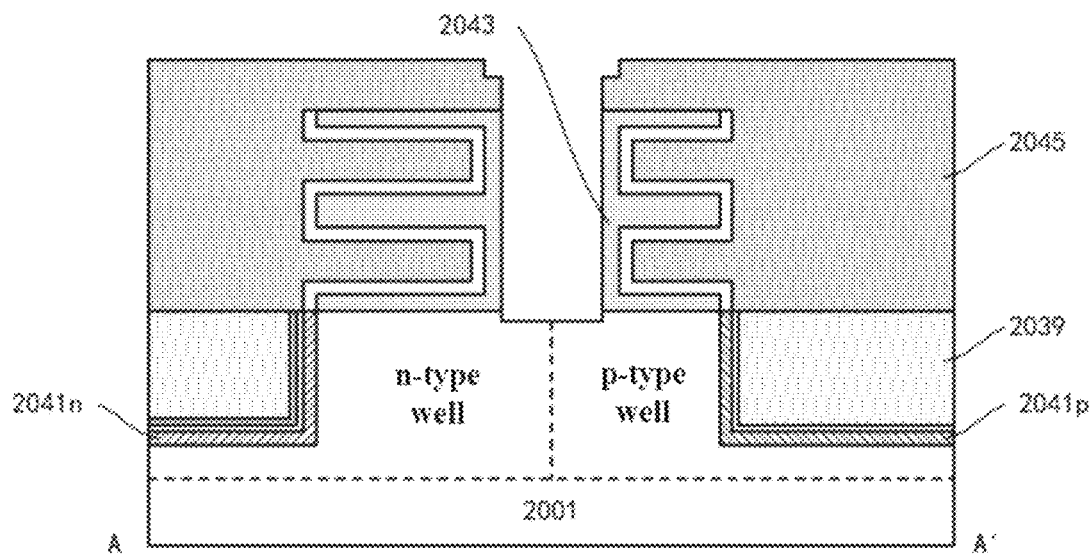

As shown in FIG. 37, the trench T2′ may be filled with the material layer and is shown integrally with the previous protective layer 2033 as 2045. Similarly, the seed layer is also shown integrally as 2043. Afterwards, the support portion 1023 may be removed to clear the trench T1′, thereby exposing the underlying substrate 2001. For this, reference may be made to the above description in conjunction with FIG. 13.

Figure 38:
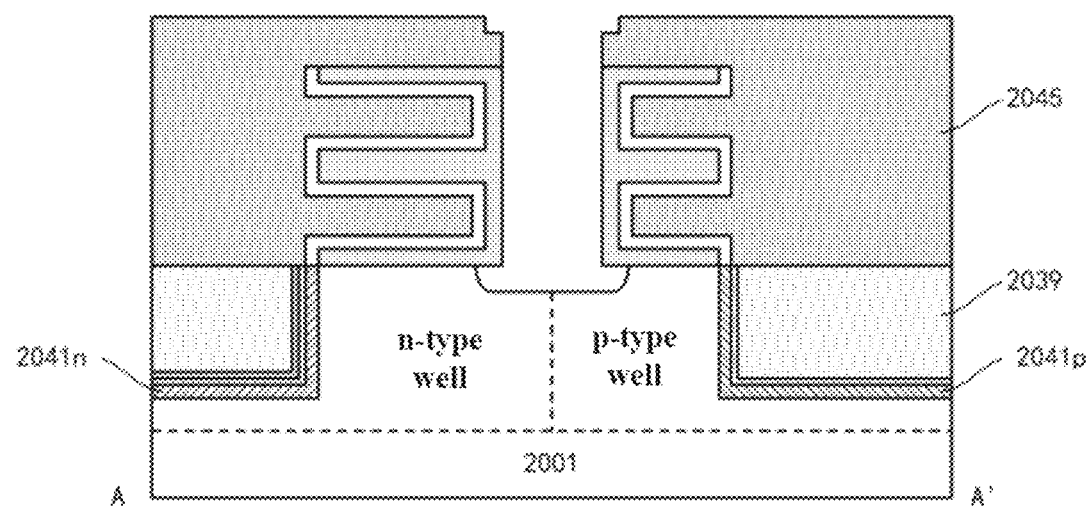

As shown in FIG. 38, a portion of the substrate 2001 may be removed by selective etching via the trench T1′. Here, the etching may be have lateral characteristics, e.g. wet etching using the TMAH solution. The etching depth may be controlled so that the etching does not extend beyond the well region.

Figure 39:
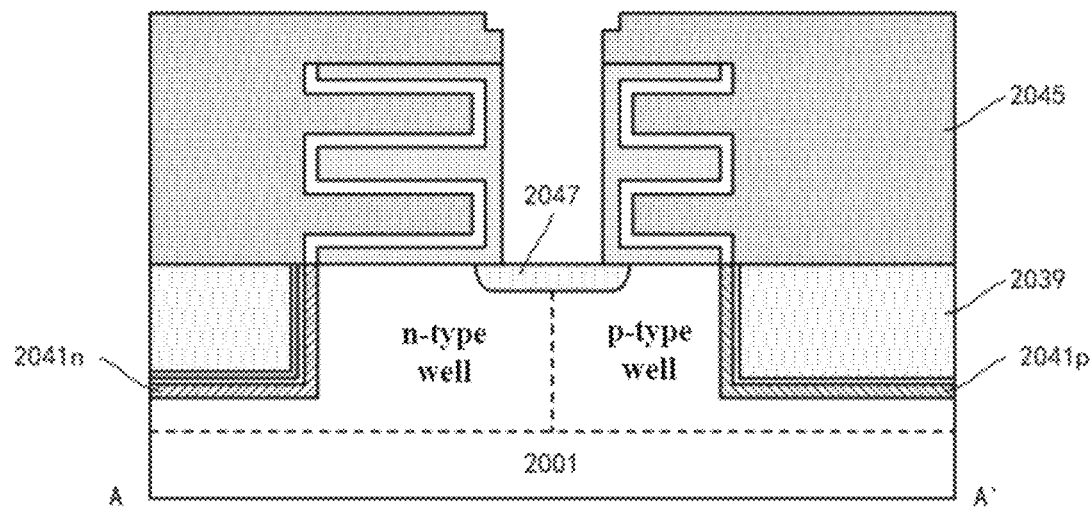

As shown in FIG. 39, an isolation layer 2047 may be formed via the trench T1. Regarding the isolation layer 2047, reference may be made to the description about the isolation layer 1047.

Figure 40:
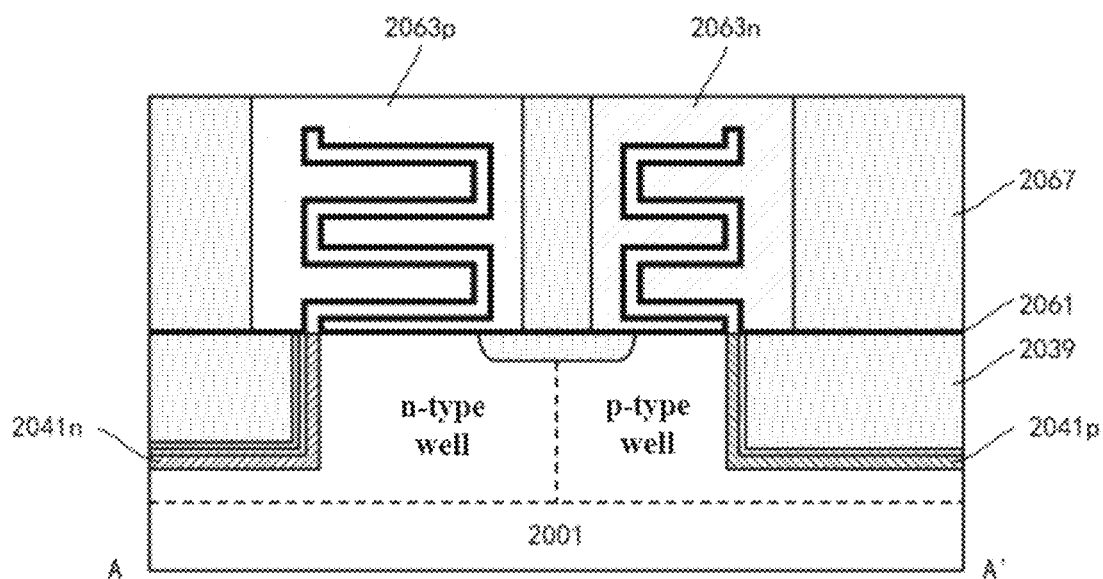

Afterwards, the gate replacement process described above may be performed, and thus a device structure shown in FIG. 40 is obtained. The device shown in FIG. 40 is substantially the same as the device shown in FIGS. 26(a) and 26(b), except for the isolation structure at the bottom of the device.

The semiconductor device according to the embodiments of the present disclosure may be applied to various electronic devices. For example, it is possible to form an integrated circuit (IC) based on such a semiconductor device, thereby constructing an electronic device. Therefore, the present disclosure also provides an electronic device including the above-mentioned semiconductor device. The electronic device may also include components such as a display screen matched with an integrated circuit and a wireless transceiver matched with an integrated circuit. Such an electronic device includes, for example, a smart phone, a computer, a tablet computer (PC), an artificial intelligence device, a wearable device, a mobile power supply, etc.

According to some embodiments of the present disclosure, a manufacturing method of a system on chip (SoC) is also provided. The method may include the method described above. Specifically, a variety of devices may be integrated on the chip, at least some of which are manufactured according to the method of the present disclosure.

In the above description, the technical details such as patterning and etching of each layer are not described in detail. However, those skilled in the art should understand that various technical means may be configured to form layers, areas, etc. of desired shapes. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising a semiconductor layer extending in zigzag in a vertical direction with respect to a substrate, wherein the semiconductor layer comprises:
   first portions disposed in sequence and spaced apart from each other in the vertical direction; and
   second portions respectively disposed on and connected to opposite ends of each first portion,
   wherein a second portion at one end of each first portion extends from the one end in a direction of leaving the substrate, a second portion at the other end of the each first portion extends from the other end in a direction of approaching the substrate, and first portions adjacent in the vertical direction are connected to each other by the same second portion,
   a pair of source/drain portions located on opposite sides of the semiconductor layer in a first direction on the substrate and connected to the semiconductor layer; and
   a gate stack extending in a second direction on the substrate and intersecting the semiconductor layer, wherein the second direction intersects the first direction,
   wherein the gate stack extends on surfaces of the first portions of the semiconductor layer that are opposite to each other in the vertical direction and extends on surfaces of the second portions of the semiconductor layer that are opposite to each other in the second direction.

2. The semiconductor device according to claim 1, wherein the semiconductor layer is integral and has a substantially uniform thickness.

3. The semiconductor device according to claim 1, wherein the first portions are substantially aligned in the vertical direction.

4. The semiconductor device according to claim 3, wherein the first portions have substantially the same width.

5. The semiconductor device according to claim 1, wherein second portions on the same side of each first portion are substantially aligned in the vertical direction.

6. The semiconductor device according to claim 1, wherein adjacent first portions are spaced from each other by a substantially uniform interval.

7. The semiconductor device according to claim 1, wherein the first portion is substantially parallel to a surface of the substrate, and the second portion is substantially perpendicular to the surface of the substrate.

8. The semiconductor device according to claim 1, wherein a plurality of semiconductor devices are disposed on the substrate, wherein at least one pair of adjacent semiconductor devices have respective first portions being substantially coplanar.

9. The semiconductor device according to claim 8, wherein the at least one pair of adjacent semiconductor devices are adjacent in a first direction, and the at least one pair of adjacent semiconductor devices have respective second portions being substantially coplanar.

10. The semiconductor device according to claim 8, wherein adjacent first portions and the second portion between the adjacent first portions in each semiconductor layer of each semiconductor device form an opening, and the at least one pair of adjacent semiconductor devices are adjacent in a second direction and have respective openings on the same level being face-to-face or back-to-back.

11. The semiconductor device according to claim 10, wherein for the at least one pair of adjacent semiconductor devices, a width of the first portion in the second direction is different between the adjacent semiconductor devices.

12. The semiconductor device according to claim 1, wherein:
   the semiconductor layer is in contact with the substrate at a bottom of the semiconductor layer; and
   the semiconductor device further comprises an isolation layer disposed between the gate stack and the substrate.

13. The semiconductor device according to claim 12, further comprising a punch-through stopping layer, which is formed in a portion of the semiconductor layer below the first portion closest to the substrate.

14. The semiconductor device according to claim 13, wherein the isolation layer surrounds the portion of the semiconductor layer.

15. The semiconductor device according to claim 13, further comprising: a well region formed in the substrate adjacent to the punch-through stopping layer.

16. The semiconductor device according to claim 13, wherein a top surface of the punch-through stopping layer is at a height with respect to the substrate, such that both gate stacks on opposite sides of the semiconductor layer overlap with the punch-through stopping layer.

17. The semiconductor device according to claim 13, wherein a plurality of semiconductor devices are disposed on the substrate, wherein for at least one pair of semiconductor devices, the top surfaces of the punch-through stopping layers of the semiconductor devices of each pair are at substantially the same height with respect to the substrate.

18. The semiconductor device according to claim 1, further comprising a gate spacer disposed on a sidewall of the gate stack, wherein the gate spacer comprises a portion above the first portion and a portion below the first portion.

19. The semiconductor device according to claim 18, wherein a plurality of semiconductor devices are disposed on the substrate, wherein for at least one pair of semiconductor devices adjacent in the second direction among the plurality of semiconductor devices, the gate spacer of one semiconductor device of each pair extends integrally and continuously with respect to the gate spacer of the other semiconductor device of the each pair.

20. The semiconductor device according to claim 18, wherein the portion of the gate spacer above the first portion and the portion of the gate spacer below the first portion have the same material and have substantially the same thickness.

21. The semiconductor device according to claim 18, wherein an inner sidewall of the portion of the gate spacer above the first portion is substantially aligned with an inner sidewall of the portion of the gate spacer below the first portion in the vertical direction.

22. The semiconductor device according to claim 1, wherein a plurality of semiconductor devices are disposed on the substrate, wherein semiconductor devices adjacent in the first direction among the plurality of semiconductor devices are electrically isolated from each other by an isolation portion, and a range of the isolation portion in the first direction is defined by a dummy gate spacer extending in the second direction.

23. The semiconductor device according to claim 22, wherein a range of a top of the source/drain portion of the semiconductor device in the first direction is defined by a gate spacer of the semiconductor device and the dummy gate spacer of the semiconductor device.

24. The semiconductor device according to claim 1, wherein a plurality of semiconductor devices are disposed on the substrate, wherein semiconductor devices adjacent in the first direction among the plurality of semiconductor devices are electrically isolated from each other by an isolation portion extending in the second direction.

25. The semiconductor device according to claim 24, wherein the source/drain portion extends in the second direction; and
   wherein the semiconductor device further comprises a gate spacer disposed between the gate stack and the source/drain portion, and a dummy gate spacer disposed between the source/drain portion and the isolation portion, wherein the gate spacer and the dummy gate spacer have substantially the same thickness in the first direction.

26. The semiconductor device according to claim 25, further comprising: an additional semiconductor layer which is aligned with the dummy gate spacer in the vertical direction and extends in zigzag in the same way as the semiconductor layer.

27. An electronic device comprising the semiconductor device according to claim 1.

28. The electronic device according to claim 27, wherein the electronic device comprises a smart phone, a computer, a tablet, an artificial intelligence device, a wearable device, or a mobile power supply.

* * * * *